(12) United States Patent
Shou et al.

(10) Patent No.: US 6,281,831 B1
(45) Date of Patent: Aug. 28, 2001

(54) ANALOG TO DIGITAL CONVERTER

(75) Inventors: Guoliang Shou; Ying Chen; Takashi Tomatsu, all of Tokyo (JP)

(73) Assignee: Yozan Inc., Tokyo (JP)

(*) Notice: Subject to any disclaimer, the term of this patent is extended or adjusted under 35 U.S.C. 154(b) by 0 days.

(21) Appl. No.: 09/075,342

(22) Filed: May 11, 1998

(30) Foreign Application Priority Data

May 15, 1997 (JP) .................................................. 9-139111
May 29, 1997 (JP) .................................................. 9-154309

(51) Int. Cl.[7] .................................................. H03M 1/36
(52) U.S. Cl. .................... 341/159; 341/172; 341/155; 341/150; 327/75
(58) Field of Search .................... 341/159, 136, 341/155, 165, 172, 158; 327/77, 75; 326/59; 365/184

(56) References Cited

U.S. PATENT DOCUMENTS

| | | | |
|---|---|---|---|
| 4,399,426 | * 8/1983 | Tan | 341/155 |
| 4,816,701 | * 3/1989 | Ando et al. | 307/362 |
| 4,908,624 | * 3/1990 | Goto et al. | 341/172 |
| 5,016,014 | * 5/1991 | Bitting | 341/172 |
| 5,075,688 | * 12/1991 | Hosotani et al. | 341/159 |
| 5,202,956 | * 4/1993 | Mashiko | 395/24 |
| 5,204,560 | * 4/1993 | Bredin et al. | 307/530 |
| 5,225,837 | * 7/1993 | Hosotani et al. | 341/159 |
| 5,272,481 | * 12/1993 | Sauer | 341/165 |
| 5,396,581 | * 3/1995 | Mashiko | 395/24 |
| 5,402,128 | * 3/1995 | Kusumoto et al. | 341/172 |
| 5,581,252 | * 12/1996 | Thomas | 341/172 |
| 5,600,270 | * 2/1997 | Shou et al. | 327/75 |
| 5,638,072 | * 6/1997 | Van Auken et al. | 341/172 |
| 5,661,482 | * 8/1997 | Shou et al. | 341/150 |
| 5,675,340 | * 10/1997 | Hester et al. | 341/172 |
| 5,793,321 | * 8/1998 | Shou et al. | 341/155 |
| 5,864,312 | * 1/1999 | Shou et al. | 341/200 |
| 5,951,632 | * 9/1999 | Kochi | 708/801 |
| 6,118,400 | * 9/2000 | Susak | 341/172 |

* cited by examiner

*Primary Examiner*—Peguy Jeanpierre
*Assistant Examiner*—Jean Bruner Jeanglaude
(74) *Attorney, Agent, or Firm*—Pillsbury Winthrop LLP

(57) ABSTRACT

An A/D converter having a plurality of thresholding circuits corresponding to bits of output digital data, each of which includes odd number of inverters serially connected from a first stage to a last stage. The first stage inverter of the thresholding circuits have thresholds equal to a weights of the bits. The inverters of the last stage are of thresholds different from those of the first stage.

13 Claims, 17 Drawing Sheets

Fig. 2

| Analog Input Voltage | | | Intermediate Output | | | | Output | | | |
|---|---|---|---|---|---|---|---|---|---|---|
| Vin | | | Vb0' | Vb1' | Vb2' | Vb3' | d0 | d1 | d2 | d3 |
| Vin< | | A0 | Vdd | Vdd | Vdd | Vdd | 0 | 0 | 0 | 0 |
| A0 | ≦Vin< | A1 | 0 | Vdd | Vdd | Vdd | 1 | 0 | 0 | 0 |
| A1 | ≦Vin< | A2 | Vdd | 0 | Vdd | Vdd | 0 | 1 | 0 | 0 |
| A2 | ≦Vin< | A3 | 0 | 0 | Vdd | Vdd | 1 | 1 | 0 | 0 |
| A3 | ≦Vin< | A4 | Vdd | Vdd | 0 | Vdd | 0 | 0 | 1 | 0 |
| A4 | ≦Vin< | A5 | 0 | Vdd | 0 | Vdd | 1 | 0 | 1 | 0 |
| A5 | ≦Vin< | A6 | Vdd | 0 | 0 | Vdd | 0 | 1 | 1 | 0 |
| A6 | ≦Vin< | A7 | 0 | 0 | 0 | Vdd | 1 | 1 | 1 | 0 |
| A7 | ≦Vin< | A8 | Vdd | Vdd | Vdd | 0 | 0 | 0 | 0 | 1 |
| A8 | ≦Vin< | A9 | 0 | Vdd | Vdd | 0 | 1 | 0 | 0 | 1 |
| A9 | ≦Vin< | A10 | Vdd | 0 | Vdd | 0 | 0 | 1 | 0 | 1 |
| A10 | ≦Vin< | A11 | 0 | 0 | Vdd | 0 | 1 | 1 | 0 | 1 |
| A11 | ≦Vin< | A12 | Vdd | Vdd | 0 | 0 | 0 | 0 | 1 | 1 |
| A12 | ≦Vin< | A13 | 0 | Vdd | 0 | 0 | 1 | 0 | 1 | 1 |
| A13 | ≦Vin< | A14 | Vdd | 0 | 0 | 0 | 0 | 1 | 1 | 1 |
| A14 | ≦Vin | | 0 | 0 | 0 | 0 | 1 | 1 | 1 | 1 |

Fig. 7

| $D_3$ ($V_{d3}$) | $D_2$ ($V_{d2}$) | $D_1$ ($V_{d1}$) | $D_0$ ($V_{d0}$) | $V_{th}$ |
|---|---|---|---|---|
| 0 ( 0 ) | 0 ( 0 ) | 0 ( 0 ) | 0 ( 0 ) | $16V_{ref}/8$ |
| 0 ( 0 ) | 0 ( 0 ) | 0 ( 0 ) | 1 ($2V_{ref}$) | $15V_{ref}/8$ |
| 0 ( 0 ) | 0 ( 0 ) | 1 ($2V_{ref}$) | 0 ( 0 ) | $14V_{ref}/8$ |
| 0 ( 0 ) | 0 ( 0 ) | 1 ($2V_{ref}$) | 1 ($2V_{ref}$) | $13V_{ref}/8$ |
| 0 ( 0 ) | 1 ($2V_{ref}$) | 0 ( 0 ) | 0 ( 0 ) | $12V_{ref}/8$ |
| 0 ( 0 ) | 1 ($2V_{ref}$) | 0 ( 0 ) | 1 ($2V_{ref}$) | $11V_{ref}/8$ |
| 0 ( 0 ) | 1 ($2V_{ref}$) | 1 ($2V_{ref}$) | 0 ( 0 ) | $10V_{ref}/8$ |
| 0 ( 0 ) | 1 ($2V_{ref}$) | 1 ($2V_{ref}$) | 1 ($2V_{ref}$) | $9V_{ref}/8$ |
| 1 ($2V_{ref}$) | 0 ( 0 ) | 0 ( 0 ) | 0 ( 0 ) | $8V_{ref}/8$ |
| 1 ($2V_{ref}$) | 0 ( 0 ) | 0 ( 0 ) | 1 ($2V_{ref}$) | $7V_{ref}/8$ |
| 1 ($2V_{ref}$) | 0 ( 0 ) | 1 ($2V_{ref}$) | 0 ( 0 ) | $6V_{ref}/8$ |
| 1 ($2V_{ref}$) | 0 ( 0 ) | 1 ($2V_{ref}$) | 1 ($2V_{ref}$) | $5V_{ref}/8$ |
| 1 ($2V_{ref}$) | 1 ($2V_{ref}$) | 0 ( 0 ) | 0 ( 0 ) | $4V_{ref}/8$ |
| 1 ($2V_{ref}$) | 1 ($2V_{ref}$) | 0 ( 0 ) | 1 ($2V_{ref}$) | $3V_{ref}/8$ |
| 1 ($2V_{ref}$) | 1 ($2V_{ref}$) | 1 ($2V_{ref}$) | 0 ( 0 ) | $2V_{ref}/8$ |
| 1 ($2V_{ref}$) | 1 ($2V_{ref}$) | 1 ($2V_{ref}$) | 1 ($2V_{ref}$) | $V_{ref}/8$ |

| Thresholding Circuit | Capacitance | Capacity |
|---|---|---|
| Th 3 | C 3 1 | 1 6 C u |
|  | C 3 2 | 8 C u |
|  | C 3 3 | 8 C u |
| Th 2 | C 2 1 | 1 6 C u |
|  | C 2 2 | 4 C u |
|  | C 2 3 | 4 C u |
|  | C 2 4 | 8 C u |
| Th 1 | C 1 1 | 1 6 C u |
|  | C 1 2 | 2 C u |
|  | C 1 3 | 2 C u |
|  | C 1 4 | 4 C u |
|  | C 1 5 | 8 C u |
| Th 0 | C 0 1 | 1 6 C u |
|  | C 0 2 | 1 C u |
|  | C 0 3 | 1 C u |
|  | C 0 4 | 2 C u |
|  | C 0 5 | 4 C u |
|  | C 0 6 | 8 C u |

Fig. 18 PRIOR ART

| Analog Input Voltage | | | Intermediate Output | | | | Output | | | |
|---|---|---|---|---|---|---|---|---|---|---|
| Vin | | | Vb0' | Vb1' | Vb2' | Vb3' | d0 | d1 | d2 | d3 |
| 0 ≤Vin< | Vdd/16 | | Vdd | Vdd | Vdd | Vdd | 0 | 0 | 0 | 0 |
| Vdd/16 ≤Vin< | Vdd/8 | | 0 | Vdd | Vdd | Vdd | 1 | 0 | 0 | 0 |
| Vdd/8 ≤Vin< | 3Vdd/16 | | Vdd | 0 | Vdd | Vdd | 0 | 1 | 0 | 0 |
| 3Vdd/16 ≤Vin< | Vdd/4 | | 0 | 0 | Vdd | Vdd | 1 | 1 | 0 | 0 |
| Vdd/4 ≤Vin< | 5Vdd/16 | | Vdd | Vdd | 0 | Vdd | 0 | 0 | 1 | 0 |
| 5Vdd/16 ≤Vin< | 3Vdd/8 | | 0 | Vdd | 0 | Vdd | 1 | 0 | 1 | 0 |
| 3Vdd/8 ≤Vin< | 7Vdd/16 | | Vdd | 0 | 0 | Vdd | 0 | 1 | 1 | 0 |
| 7Vdd/16 ≤Vin< | Vdd/2 | | 0 | 0 | 0 | Vdd | 1 | 1 | 1 | 0 |
| Vdd/2 ≤Vin< | 9Vdd/16 | | Vdd | Vdd | Vdd | 0 | 0 | 0 | 0 | 1 |
| 9Vdd/16 ≤Vin< | 5Vdd/8 | | 0 | Vdd | Vdd | 0 | 1 | 0 | 0 | 1 |
| 5Vdd/8 ≤Vin< | 11Vdd/16 | | Vdd | 0 | Vdd | 0 | 0 | 1 | 0 | 1 |
| 11Vdd/16 ≤Vin< | 3Vdd/4 | | 0 | 0 | Vdd | 0 | 1 | 1 | 0 | 1 |
| 3Vdd/4 ≤Vin< | 13Vdd/16 | | Vdd | Vdd | 0 | 0 | 0 | 0 | 1 | 1 |
| 13Vdd/16 ≤Vin< | 7Vdd/8 | | 0 | Vdd | 0 | 0 | 1 | 0 | 1 | 1 |
| 7Vdd/8 ≤Vin< | 15Vdd/16 | | Vdd | 0 | 0 | 0 | 0 | 1 | 1 | 1 |
| 15Vdd/16 ≤Vin< | Vdd | | 0 | 0 | 0 | 0 | 1 | 1 | 1 | 1 |

ANALOG TO DIGITAL CONVERTER

DETAILED DESCRIPTION OF THE INVENTION

1. Field of the Invention

The present invention relates to an analog to digital converter for converting an analog voltage signal into a digital voltage signal by a voltage driven type circuit.

2. Prior Art

An analog to digital converter (AID converter) is widely used having a voltage-divider consisting of serial resistors. Such A/D converter consumes a lot of electrical power because current flows constantly through the resistor.

The inventors of the present invention have proposed an A/D converter in Patent Publication Hei09-083364, in which a plurality of thresholding circuits corresponding to a plurality of bits of a digital output voltage. The thresholding circuits are parallelly connected to an analog input voltage. An output of one thresholding circuit is input to thresholding circuits of lower bits with weighted by predetermined weight. High accuracy and low electric power consumption is realized.

FIG. 15 shows an example of four bits output of the A/D converter (quantizing circuit) above. However, the A/D converter is applicable to more number of bits. There are provided four threshold circuits Th3 to Th0 of four level thresholds corresponding to the output bits. Each of the thresholding circuits Th3 to Th0 has a capacitive coupling with a plurality of capacitances and four stages MOS inverters INVi1 to INVi4 (i=0 to 3). The first stage MOS inverter INVi1 (i=0 to 3) is of a threshold voltage Vdd/2 when a supply voltage is Vdd. INVi1 outputs Vdd when an input voltage is less than the threshold and the ground voltage GND (0) when the input is more than the threshold.

There is also a successive comparison type A/D converter having a sampling and holding circuit a comparator and a D/A converter. The error depends on the offset voltage of the sampling and holding circuit and of the comparator, and mainly on the performance of the D/A converter. The linearity is deteriorated by the D/A converter. Further, lower electrical power consumption, higher gain and higher stability are requested.

The first stage MOS inverter is for detecting whether the output of the capacitive coupling exceeds the predetermined threshold or not and the second stage MOS inverter inverts the output of the first stage MOS inverter. The third MOS increases inverting speed and the fourth inverts the output of the third MOS inverter.

The thresholding circuits generate output voltages Vb3 to Vb0, respectively, and intermediate outputs Vb3' to Vb0' are generated by the third inverters INVi3, respectively. AIN is an analog voltage input terminal, Vdd is the supply voltage and GND is the ground voltage.

The thresholding circuit Th3 of the third bit has a capacitive coupling consisting of capacitances C31, C32 and C33 for weighting the input voltages, respectively. Four stages serial MOS inverters INV31 to INV34 is connected at the first stage to an output of the capacitve coupling. An analog input voltage Vin is input from the input terminal AIN of the input capacitance C31, the supply voltage Vdd is input to the input capacitance C32 and the ground voltage GND is input to the input capacitance C33. These voltages are weighted by predetermined weights and added together, as mentioned below.

The thresholding circuit Th2 of the second bit has a capacitive coupling consisting of capacitances C21, C22, C23 and C24 for weighting the input voltages, respectively. Four stages serial MOS inverters INV21 to INV24 is connected at the first stage to an output of the capacitve coupling. An analog input voltage Vin is input to the input capacitance C21, the supply voltage Vdd is input to the input capacitance C22, the ground voltage GND is input to the input capacitance C23 and the output Vb3' is input to the input capacitance C24 from the third stage inverter INV33 of the thresholding circuit Th3.

The thresholding circuit Th1 of the first bit has a capacitive coupling consisting of capacitances C11, C12, C13, C14 and C15 for weighting the input voltages, respectively. Four stages serial MOS inverters INV11 to INV14 is connected at the first stage to an output of the capacitive coupling. An analog input voltage Vin is input to the input capacitance C11, the supply voltage Vdd is input to the input capacitance C12, the ground voltage GND is input to the input capacitance C13, the output Vb3' is input to the input capacitance C14 from the third stage inverter INV33 of the thresholding circuit Th3 and the output Vb2' of the thresholding circuit Th2 is input to the input capacitance C15.

The thresholding circuit Th0 of the LSB has a capacitive coupling consisting of capacitances C01, C02, C03, C04, C05 and C06 for weighting the input voltages, respectively. Four stages serial MOS inverters INV01 to INV04 is connected at the first stage to an output of the capacitive coupling. An analog input voltage Vin is input to the input capacitance C01, the supply voltage Vdd is input to the input capacitance C02, the ground voltage GND is input to the input capacitance C03, the output Vb3' is input to the input capacitance C06 from the third stage inverter INV33 of the thresholding circuit Th3, the output Vb2' is input to the input capacitance C05 from the third inverter INV23 of the thresholding circuit Th2 and the output Vb1' is input to the input capacitance C04 from the third inverter INV13 of the thresholding circuit Th1.

The capacity ratio of the capacitances C31 to C33, C21 to C24, C11 to C15 and C01 to C06 are shown in the table of FIG. 16. Here, Cu is a unit capacity.

As for the thresholding circuit Th0 for the LSB, the capacities for the supply voltage and the ground voltage are "1", the capacity for the intermediate output Vb1' of the higher thresholding circuit Th1 by one bit is "2", the capacity for the intermediate output Vb2' of the higher thresholding circuit Th2 by two bits is "4"(=$2^2$), the capacity for the intermediate output Vb3' of the higher thresholding circuit Th3 by three bits is "8"(=$2^3$) and the capacity for the analog input voltage Vin is "16"(=$2^4$).

As mentioned above, the intermediate outputs from the upper threshold circuits and the analog input voltage Vin are weighted by a power of "2" and added together by the weighting circuit.

In FIG. 17, an output of a capacitive coupling is shown.

FIG. 17 shows an example of a capacitive coupling consisting of input capacitances C1 to C5. Assuming that the total electric charge in the input capacitances is zero in the initial condition, the total electric charge is constant to be zero from a reference point of an output terminal when the input voltages are connected the input capacitances. The following formula (1) is given. Here, Vo is an output voltage of the output terminal.

$$C1(V1-Vo)+C2(V2-Vo)+C3(V3-Vo)+C4(V4-Vo)+C5(V5-Vo)=0 \quad (1)$$

Then, Vo is given by the formula (2).

$$Vo = \frac{\sum_{i=1}^{5} CiVi}{\sum_{i=1}^{5} Ci} \quad (2)$$

Therefore, the output of the capacitive coupling is a total summation of the input voltages weighted by the capacities of the input capacitances.

The thresholding circuit Th3 has capacity ratio of the input capacitances C31 to C33 is C31:C32:C33=16:8:8. The output voltage V3 is as in the formula (3).

$$V3 = \frac{1}{2}Vin + \frac{1}{4}Vdd \quad (3)$$

When the analog input voltage Vin=Vdd/2, V3 is equal to the threshold voltage Vth(=Vdd/2) of the inverter circuit INV31. When 0≦Vin<Vdd/2, the output of the inverter INV31, that is, the intermediate output Vb3' of the MOS inverter INV31 is Vdd and the output of the output Vb3 is zero. When Vdd/2≦Vin<Vdd, the output of the inverter INV31 is inverted, the intermediate output Vb3' becomes zero and Vb3 becomes Vdd.

The thresholding circuit Th2 has capacity ratio of the input capacitances C21 to C24 is C21:C22:C23:C24=16:4:4:8. The output voltage V3 is as in the formula (4) according to the formula (2).

$$V2 = \frac{1}{2}Vin + \frac{1}{4}Vb3' + \frac{1}{8}Vdd \quad (4)$$

When 0≦Vin<Vdd/2, Vb3'=Vdd. The formula (5) is given.

$$V2 = \frac{1}{2}Vin + \frac{3}{8}Vdd \quad (5)$$

When Vdd/2≦Vin<Vdd, Vb3'=0. The formula (6) is given.

$$V2 = \frac{1}{2}Vin + \frac{1}{8}Vdd \quad (6)$$

From the formulae (5) and (6), when Vin=Vdd/4 and Vin=(¾)Vdd, V2=Vdd/2 equal to the threshold voltage of INV21. When 0≦Vin<Vdd/4 and Vdd/2≦Vin<(¾)Vdd, the output of INV21, that is, the intermediate output Vb2' is Vdd. The output Vb2 is zero. When 0≦Vin<Vdd/4 and Vdd/2≦Vin<(¾)Vdd, the output of INV21, that is, the intermediate output Vb2' is Vdd. The output Vb2 is zero. When (¾)Vdd≦Vin<Vdd, the output of INV21, that is, the intermediate output Vb2' is zero. The output Vb2 is Vdd.

Similarly to the above, the output voltage V1 of the capacitive coupling in the thresholding circuit Th1 is expressed as in the formula (7).

$$V1 = \frac{1}{2}Vin + \frac{1}{4}Vb3' + \frac{1}{8}Vb2' + \frac{1}{16}Vdd \quad (7)$$

When 0≦Vin<Vdd/8, Vdd/4≦Vin<(⅜)Vdd, Vdd/2≦Vin<(⅝)Vdd and (¾)Vdd/2≦Vin<(⅞)Vdd, the output of INV11, that is, the intermediate output Vb1' is Vdd. The output Vb1 is zero.

When Vdd/8≦Vin<(⅖)Vdd, (⅜)Vdd≦Vin<Vdd/2, (⅝)Vdd≦Vin<(¾)Vdd and (⅞)Vdd≦Vin<Vdd, the output of INV11, that is, the intermediate output Vb1' is zero. The output Vb1 is Vdd.

The output voltage V0 of the capacitive coupling in the thresholding circuit Th0 is given by the formula (8).

$$V0 = \frac{1}{2}Vin + \frac{1}{4}Vb3' + \frac{1}{8}Vb2' + \frac{1}{16}Vb1' + \frac{1}{32}Vdd \quad (8)$$

When 0≦Vin<Vdd/16, (⅛)Vdd≦Vin<(3/16)Vdd, (¼)Vdd≦Vin<(5/16)Vdd, (⅜)Vdd≦Vin<(7/16)Vdd, (½)Vdd≦Vin<(9/16)Vdd, (⅝)Vdd≦Vin<(11/16)Vdd, (¾)Vdd≦Vin<(13/16)Vdd and (⅞)Vdd≦Vin<(15/16)Vdd, the output of INV01, that is, the intermediate output Vb0' is Vdd. The output Vb0 is zero.

When Vdd/16≦Vin<Vdd/8, (3/16)Vdd≦Vin<Vdd/4, (5/16)Vdd≦Vin<(⅜)Vdd, (7/16)Vdd≦Vin<Vdd/2, (9/16)Vdd≦Vin<(⅝)Vdd, (11/16)Vdd≦Vin<(¾)Vdd, (13/16)Vdd≦Vin<(⅞)Vdd and (15/16)Vdd≦Vin<Vdd, the output of INV01, that is, the intermediate output Vb0' is zero. The output Vb0 is Vdd.

As shown in the table of the FIG. 18, the analog input voltage is converted into 4 bit digital data of bits d0 to d3.

The accuracy of the A/D converter is deteriorated by the residual electrical charge in the input capacitances and the inverters. The first, third and fourth inverters in the thresholding circuit are provided with switches, respectively. Each of switches short-circuits the input and output of the inverter and simultaneously a reference voltage is input to the input capacitances, the residual charge is canceled.

Another A/D converter proposed by the inventors is described next. A pair of A/D converters shown in FIG. 15 are used for improving the accuracy of the digital output. FIG. 19 is a block diagram of this A/D converter. INV1 and INV2 in the figure are inverting amplifiers. The inverting amplifiers consist of a series of odd number (for example three) of CMOS inverters as an amplifier, which alternatively outputs a high level output and a low level output.

An analog input voltage terminal is connected through an input capacitance C1 to an input of the first inverting amplifier INV1. A feedback capacitance Cf1 is connected between the output of the input and the first inverting amplifier. A capacitance C2 is connected between the output of the inverting amplifier INV1 and the input of the second inverting amplifier INV2. A feedback capacitance Cf2 is connected between the output and the input of the second inverting amplifier INV2.

A pair of refresh switches Sr11 and Sr12 are connected between the input and output of the amplifier INV1 and INV2, respectively, for short circuiting. The switches are controlled by a refresh signal REF, and the switches are conductive when a high level signal is fed into the REF.

The refresh signal REF controls multi-plexers MUX11, MUX12 and MUX13. When the signal fed into the REF is a low level signal MUX11 selects the analog input voltage VIN to be connected to the input capacitance C1, MUX12 selects the analog input voltage VIN to be connected to the first quantizing circuit Q1, and MUX13 selects the output of the amplifier INV2 to be connected to the second quantizing circuit. When REF is high level, MUX11 selects the reference voltage Vref1 of INV1 and INV2, and MUX12 and MUX13 select the reference voltage Vref of the first and second quantizing circuits.

Q1 and Q2 are A/D converters, or quantizing circuits, shown in FIG. 15. The first quantizing circuit Q1 is connected at its input to the analog input voltage VIN. As mentioned above, Q1 outputs four outputs Vb3 to Vb0 corresponding to four bits of a digital data. These outputs are input through a capacitive coupling consisting of capacitances Cb3 to Cb0 to the input of INV2.

The input of Q2 is connected through MUX13 to the output of INV2. The second quantizing circuit outputs Va3 to Va0 corresponding to the four bits of the digital data.

A situation when the refresh signal REF is set to the low level is described below.

Since INV1 and INV2 have high gains given by a multiplication of gains of the three stages CMOS inverters, the voltage at the input is substantially constant. This voltage is designed to be Vdd/2 for maximizing the dynamic range.

The capacity is preserved similarly to the above, so INV1 generates an output voltage Vo1 given by a capacity ratio of the input capacitance C1 and the feedback capacitance Cf1 with good linearity. The output voltage Vo1 is expressed as in the formula (9) when the input voltage of INV1 is Vin1.

$$Vo1 - Vin1 = -\frac{C1(Vin - Vin1)}{Cf1} \quad (9)$$

The amplifier INV2 is connected through the capacitance C2 to the output of INV1 and is connected through the capacitive coupling consisting of the capacitances Cb3 to Cb0 to the output of the quantizing circuit Q1. When the input and output voltages of INV2 are Vin2 and Vo2, the formula (10) is given.

$$Vo2 - Vin2 = \frac{(Vo1 - Vin2)C2 + \sum_{i=0}^{3}(Vbi - Vin2)Cbi}{Ch2} \quad (10)$$

As mentioned above, Vin2=Vdd/2. The capacity ratio of the capacitances is set as in the formula (11).

C1:Cf1=1:1

C2:Cf2:Cb0:Cb1:Cb2:Cb3=16:1:1:2:4:8 (11)

The output voltage Vo2 of INV2 is given from the formulae (10) and (11) as in the formula (12).

$$Vo2 = 16 \cdot \left(Vin - \frac{\sum_{i=0}^{3} 2^i \cdot Vbi}{16}\right) \quad (12)$$

The output voltage Vo2 of INV2 is given by a subtraction of the four bits digital data from Vin of Q1.

The output voltage Vo2 is input to the second quantizing circuit Q2 and converted into four bits digital data Va3 to Va0 similarly to the above. The data corresponds to lower 4 bits of the eight bits digital data converted from the input voltage Vin. The four bits data Vb3 to Vb0 from the first quantizing circuit Q1 corresponds to upper four bits otput from the A/D converter.

When REF is low level, MUX11 to MUX13 select the reference voltages Vref1 and Vref. The refresh switches Sr1 and Sr2 are closed. The resistive charge in the capacitances and the inverting amplifiers is cancelled. Then, the input analog voltage is A/D converted into an accurate digital data.

As mentioned above, a low power and accurate analog to digital conversion is realized by a voltage driven A/D converter. A voltage of a range between the supply voltage Vdd and the ground voltage GND is converted into k bits digital data. When the variable range of input voltage, that is, the difference between the upper limit and lower limit of the input voltage is narrower than the difference between Vdd and GND, the output resolution becomes lower.

The A/D converter is sometimes unstable at a predetermined input voltage.

FIG. 20 shows the output of the A/D converter. In FIG. 20, a timing chart (a) shows the output from the thresholding circuit Th3 corresponding to MSB, with showing the input voltage by a broken line. Timing charts (b), (c) and (d) show the output from Th2, Th1 and Th0, respectively.

As will be understood from FIG. 20, the outputs from the thresholding circuits are unstable when the input voltage Vin is around a predetermined voltage.

The unstableness is caused by the fact that the thresholds of the thresholding circuits serially connected are equal to Vdd/2. When one thresholding circuit outputs a voltage to the adjacent threshold, the following inverters become unstable. It influences the thresholding circuits of lower bits. The total circuits are unstable. A noise included in the input voltage may make the output unstable.

SUMMARY OF THE INVENTION

An A/D converter according to the present invention has a range of input voltage adjustable from the outside between the upper and lower limits. The input voltage adjusted is converted into a digital data of a predetermined number of bits. The present invention has an object to provide an A/D converter of high accuracy.

The unstableness of the output of the voltage driven A/D converter is prevented. The residual charge in the capacitances etc. is cancelled in the above A/D converter of stable output in order to guarantee high accuracy. The electric power consumption is decreased in the above A/D converter.

An A/D converter according to the present invention having a plurality of thresholding circuits corresponding to the bits of output digital data, each of which includes odd number of inverters serially connected from a first stage to a last stage. The first stage inverter of the thresholding circuits have thresholds equal to a weights of the bits. The inverters of the last stage are of thresholds different from those of the first stage.

BRIEF DESCRIPTION OF THE DRAWINGS

FIG. 2 is a table showing outputs of the analog to digital converter in FIG. 1.

FIG. 7 is a table showing outputs of the analog to digital converter in FIG. 6.

FIG. 18 is a table showing a relationship between input and output of the circuit in FIG. 15.

PREFERRED EMBODIMENT OF THE PRESENT INVENTION

Figure 1:
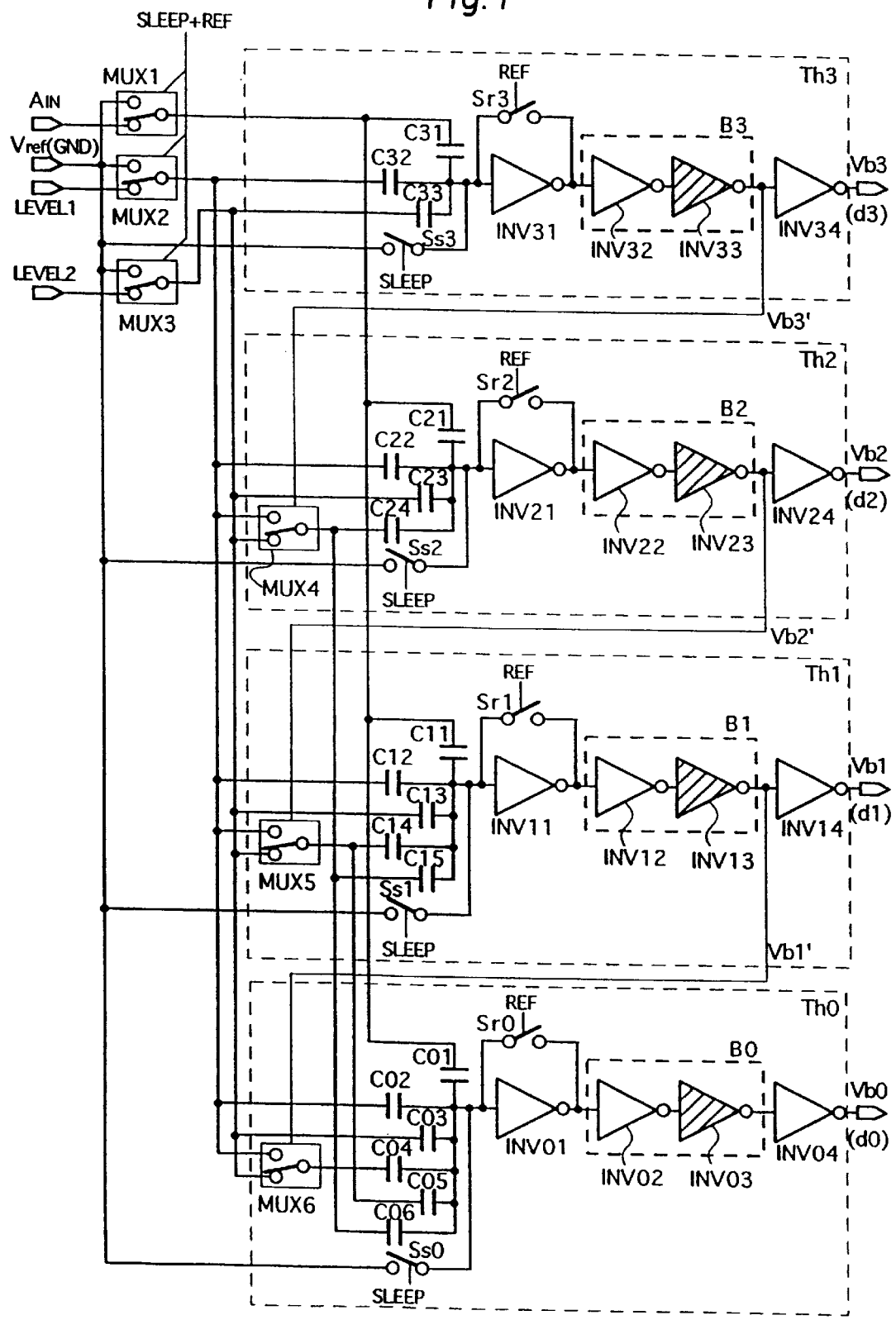
FIG. 1 is a circuit diagram of the first embodiment of an A/D converter according to the present invention.

FIG. 1 is a block diagram of the first embodiment of an A/D converter according to the present invention. This A/D converter corresponds to the circuit in FIG. 15, so similar or equivalent portions of the embodiment are designated by the same references. The capacity of input capacitances are shown in FIG. 16 similarly to in FIG. 15.

In FIG. 1, the A/D converter has four input terminals AIN for an analog voltage input, Vref for a reference voltage input, LEVEL1 for the first level voltage input, LEVEL2 for the second level voltage input. The terminal AIN receives an input voltage Vin. The reference voltage Vref=Vdd/2, the first level voltage corresponds to an upper limit of the input voltage, and the second level voltage corresponds to an lower limit of the input voltage. When the full range of the input voltage is from 0 to Vdd, the first level LEVEL1=Vdd and the second level LEVEL2=GND, similarly to the case above. The upper and lower limits of the input voltage is supplied from the outside.

Vin, LEVEL1 and LEVEL2 are input through multi-plexers MUX1 to MUX3 to the thresholding circuits. These multi-plexers are controlled by a control signal of a logical OR of a sleep signal and a refresh signal.

Figure 15:
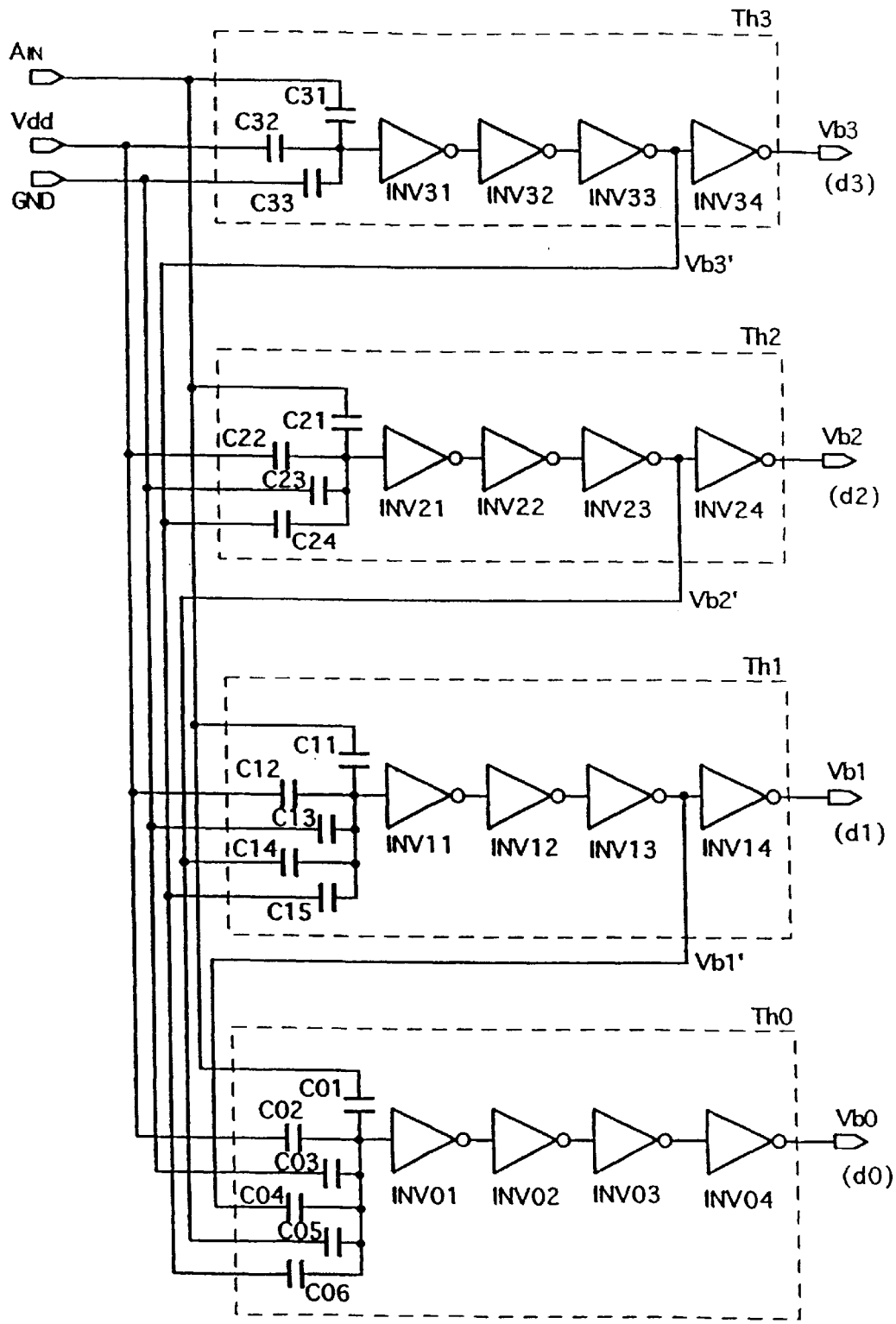
FIG. 15 is a circuit diagram of a prior art.
Figures 16, 17:
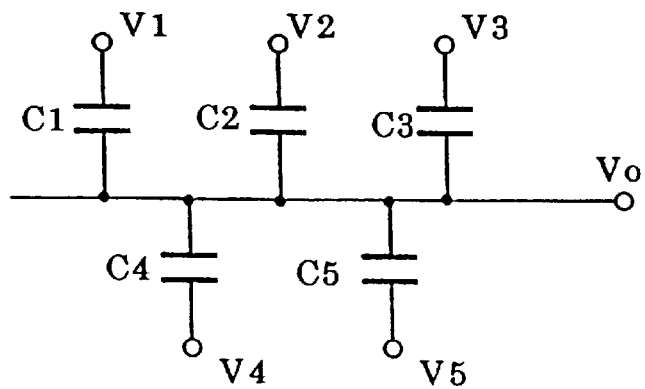
FIG. 16 is a table showing capacity ratio of the input capacitances.
FIG. 17 shows an example of a capacitive coupling.

The thresholding circuits Th3 to Th0 have four inverters similarly to the circuit in FIG. 15. The first stage inverters INVi1 (i=3 to 0) have the threshold of Vdd/2, the third stage inverters INVi3 (i=3 to 0) shown by oblique lines have different threshold from other inverters INVi1, INVi2 and INVi4 (i=3 to 0). The second stage inverter INVi2 (i=3 to 0) have preferably different threshold from the first inverters INVi1 (i=3 to 0).

There are provided serial circuits consisting of inverters INV32 and INV33 of different thresholds, consisting of inverters INV22 and INV23 of different thresholds, consisting of inverters INV12 and INV13 of different thresholds and consisting of inverters INV02 and INV03 of different thresholds. The serial circuits work as bi-stable circuits B3 to B0 having two stable status of outputs. The unstable oscillation of the output in the conventional circuits is prevented by these circuits of the different thresholds.

Sleep switches Ss3, Ss2, Ss1 and Ss0 are connected to the input of the first stage inverters INV31, INV21, INV11 and INV01 of the thresholding circuits Th3 to Th0, which are connected to the reference voltage Vref. The sleep signal SLEEP is input to the switch Ss3 to Ss0 as a control signal so that the switches are conductive when SLEEP is high level. At that time, the ground voltage GND is connected to the reference voltage input Vref instead of the reference voltage Vref.

Refresh switches Sr3 to Sr0 are connected between the input and output of each of the first stage inverters INV31 to INV01 of the thresholding circuits Th3 to Th0 for short-circuiting the input and output. The refresh signal REF is input to the switch Sr3 to Sr0 as a control signal so that the switches are conductive when REF is high level.

Intermediate outputs of the thresholding circuits Th3 to Th1 are input to the lower shareholding circuits Th2 to Th0 as control signals for the multi-plexers MUX4 to MUX6. The A/D conversion is performed similarly to the conventional circuits. In this embodiment, the intermediate outputs are not directly input to the lower thresholding circuits but input to the multi-plexers MUX4 to MUX6 which alternatively input voltages LEVEL1 or LEVEL2 to the thresholding circuits Th2 to Th0, respectively.

When both of REF and SLEEP are low level in a normal performance condition, MUX4 outputs LEVEL1 or LEVEL2 to the lower thresholding circuits Th2 to Th0 in response to the control signal of the intermediate output from Th3. When the intermediate output Vb3' from Th3 is Vdd (high level), MUX4 selects LEVEL1 so that LEVEL1 supplied from the outside is impressed to the capacitances C24, C15 and C06. When the intermediate output Vb3' from Th3 is 0 (low level), MUX4 selects LEVEL2 so that LEVEL2 supplied from the outside is impressed to the capacitances C24, C15 and C06.

MUX5 outputs LEVEL1 or LEVEL2 to the lower thresholding circuits Th1 and Th0 in response to the control signal of the intermediate output from Th2. MUX6 outputs LEVEL1 or LEVEL2 to the lower thresholding circuit Th0 in response to the control signal of the intermediate output from Th1

The performance of the A/D conversion is as follows.

Since the capacity ratio of capacitances C31 to C33 is as in the table 7 (FIG. 16), that is, C31:C32:C33=16:8:8, the output voltage of a capacitive coupling consisting of the capacitances C31 to C33, that is, the input voltage V3 of INV31 is give as in the formula (13). Here, Vin is the input voltage from the analog voltage input terminal AIN, LV1= LEVEL1 and LV2=LEVEL2.

$$V3 = \frac{Vin}{2} + \frac{LV1 + LV2}{4} \tag{13}$$

Since the capacity ratio C21:C22:C23:C24=16:4:4:8, the output voltage of a capacitive coupling consisting of the capacitances C21 to C24, that is, the input voltage V2 of INV21 is give as in the formula (14). Here, Vd3 is the output voltage from MUX4. Vd3=LV1 when Vb3' is high level, and Vd3=LV2 when Vb3' is low level.

$$V2 = \frac{Vin}{2} + \frac{Vd3}{4} + \frac{LV1 + LV2}{8} \tag{14}$$

The input voltages V1 and V0 of the inverters INV11 and INV01 are as in the formulae (15) and (16), respectively. Here, Vd2 and Vd1 are the outputs from MUX5 and MUX6, respectively.

$$V1 = \frac{Vin}{2} + \frac{Vd3}{4} + \frac{Vd2}{8} + \frac{LV1 + LV2}{16} \tag{15}$$

-continued
$$V0 = \frac{Vin}{2} + \frac{Vd3}{4} + \frac{Vd2}{8} + \frac{Vd1}{16} + \frac{LV1 + LV2}{32} \quad (16)$$

The threshold of the first stage inverter INV31 of the thresholding circuit Th3 of MSB is Vdd/2, the input voltage Vin for inverting INV31 is as in the formula 17.

$$\frac{Vin}{2} + \frac{LV1 + LV2}{4} = \frac{Vdd}{2} \quad (17)$$

INV31 is inverted when Vin is as in the formula (18). Here, A7 is Vin.

$$Vin = Vdd - \frac{LV1 + LV2}{2} (\equiv A7) \quad (18)$$

When (Vdd−LV1)≦Vin<A7, the output Vb3' of INV31 is high level and MUX4 selectively outputs the first input voltage LEVEL1. When A7≦Vin<(Vdd−LV2), the output Vb3' of INV31 is low level and MUX4 selectively outputs the second input voltage LEVEL2.

INV21 of the thresholding circuit Th2 corresponding to the second bit is inverted when vin is as follows. When (Vdd−LV1)≦Vin<A7, MUX4 selectively outputs LEVEL1 to C24. So, the formula (19) is given from the formula (14). The inverter 21 is inverted when the input voltage Vin is as in the formula (20).

$$\frac{Vin}{2} + \frac{LV1}{4} + \frac{LV1 + LV2}{8} = \frac{Vdd}{2} \quad (19)$$

$$Vin = Vdd - \left(\frac{LV1}{2} + \frac{LV1 + LV2}{4}\right)(\equiv A3) \quad (20)$$

When A7≦Vin<(Vdd−LV2), MUX4 selectively outputs the second input voltage LEVEL2. So, the formula (21) is given from the formula (14). The inverter 21 is inverted when the input voltage Vin is as in the formula (22) from the formula (21).

$$\frac{Vin}{2} + \frac{LV2}{4} + \frac{LV1 + LV2}{8} = \frac{Vdd}{2} \quad (21)$$

$$Vin = Vdd - \left(\frac{LV2}{2} + \frac{LV1 + LV2}{4}\right)(\equiv A11) \quad (22)$$

The output Vb2' from the inverter INV21 of the thresholding circuit Th2 corresponding to the second bit is high level, when (Vdd−LV1)≦Vin<A3 or A7≦Vin<A11. Then MUX5 outputs LEVEL1. When A3≦Vin<A7 or A11≦Vin<(Vdd−LV2), Vb2' is low level and MUX5 outputs LEVEL2.

INV11 of the thresholding circuit Th1 corresponding to the first bit is inverted when Vin is as follows. When Vin<A3, Vb3' of the thresholding circuit Th3 corresponding to the third bit is high level. MUX4 and MUX5 selectively output LEVEL1 and Vd3=Vd2=LV1. The formula (23) is given from the formula (15).

$$\frac{Vin}{2} + \frac{LV1}{4} + \frac{LV1}{8} + \frac{LV1 + LV2}{16} = \frac{Vdd}{2} \quad (23)$$

The inverter 11 is inverted when the input voltage Vin is as in the formula (24) from the formula (23).

$$Vin = Vdd - \left(\frac{LV1}{2} + \frac{LV1}{4} + \frac{LV1 + LV2}{16}\right)(\equiv A1) \quad (24)$$

When A3≦Vin<A7, the output Vb3' from the thresholding circuit Th3 is high level and Vb2' from the thresholding circuit Th2 is low level. In MUX4, Vd3=LV1, and in MUX5,Vd2=LV2 . The following formula (25) is given from the formula (15).

$$\frac{Vin}{2} + \frac{LV1}{4} + \frac{LV2}{8} + \frac{LV1 + LV2}{16} = \frac{Vdd}{2} \quad (25)$$

The inverter INV11 is inverted when the input voltage Vin is as in the formula (26). Here, the input voltage is A5.

$$Vin = Vdd - \left(\frac{LV1}{2} + \frac{LV2}{4} + \frac{LV1 + LV2}{16}\right)(\equiv A5) \quad (26)$$

When A7≦Vin<A11, the output Vb3' from the thresholding circuit Th3 is low level and Vb2' from the thresholding circuit Th2 is high level. In MUX4, Vd3=LV2, and in MUX5,Vd2=LV1 . The inverter INV11 is inverted when the input voltage Vin is as in the formula (27) from the formula (15). Here, the input voltage is A9.

$$Vin = Vdd - \left(\frac{LV2}{2} + \frac{LV1}{4} + \frac{LV1 + LV2}{16}\right)(\equiv A9) \quad (27)$$

When A11≦Vin, the output Vb3' from the thresholding circuit Th3 is low level and Vb2' from the thresholding circuit Th2 is low level. Vd3=LV2 and Vd2=LV2. By substituting the formula (15) by these values, the inverter INV11 is inverted when the input voltage Vin is as in the formula (28). Here, the input voltage is A13.

$$Vin = Vdd - \left(\frac{LV2}{2} + \frac{LV2}{4} + \frac{LV1 + LV2}{16}\right)(\equiv A13) \quad (28)$$

The input voltage for inverting the inverter INV01 of the thresholding circuit Th0 corresponding to LSB is given from the formula (16). The input voltages for inverting INV01 are A0, A2, A4, A6, A8, A10, A12 and A14.

$$A0 = Vdd - \left(\frac{LV1}{2} + \frac{LV1}{4} + \frac{LV1}{8} + \frac{LV1 + LV2}{16}\right) \quad (29)$$

$$A2 = Vdd - \left(\frac{LV1}{2} + \frac{LV1}{4} + \frac{LV2}{8} + \frac{LV1 + LV2}{16}\right) \quad (30)$$

$$A4 = Vdd - \left(\frac{LV1}{2} + \frac{LV2}{4} + \frac{LV1}{8} + \frac{LV1 + LV2}{16}\right) \quad (31)$$

$$A6 = Vdd - \left(\frac{LV1}{2} + \frac{LV2}{4} + \frac{LV2}{8} + \frac{LV1 + LV2}{16}\right) \quad (32)$$

$$A8 = Vdd - \left(\frac{LV2}{2} + \frac{LV1}{4} + \frac{LV1}{8} + \frac{LV1 + LV2}{16}\right) \quad (33)$$

$$A10 = Vdd - \left(\frac{LV2}{2} + \frac{LV1}{4} + \frac{LV2}{8} + \frac{LV1 + LV2}{16}\right) \quad (34)$$

$$A12 = Vdd - \left(\frac{LV2}{2} + \frac{LV2}{4} + \frac{LV1}{8} + \frac{LV1 + LV2}{16}\right) \quad (35)$$

-continued $$A14 = Vdd - \left(\frac{LV2}{2} + \frac{LV2}{4} + \frac{LV2}{8} + \frac{LV1+LV2}{16}\right) \quad (36)$$

FIG. 2 shows the performance above. As shown in FIG. 2, the input voltage between the upper limit LEVEL1 and the lower limit LEVEL2 is converted into a digital data of a predetermined bits, for example four bits as in the above embodiment.

Figure 3:
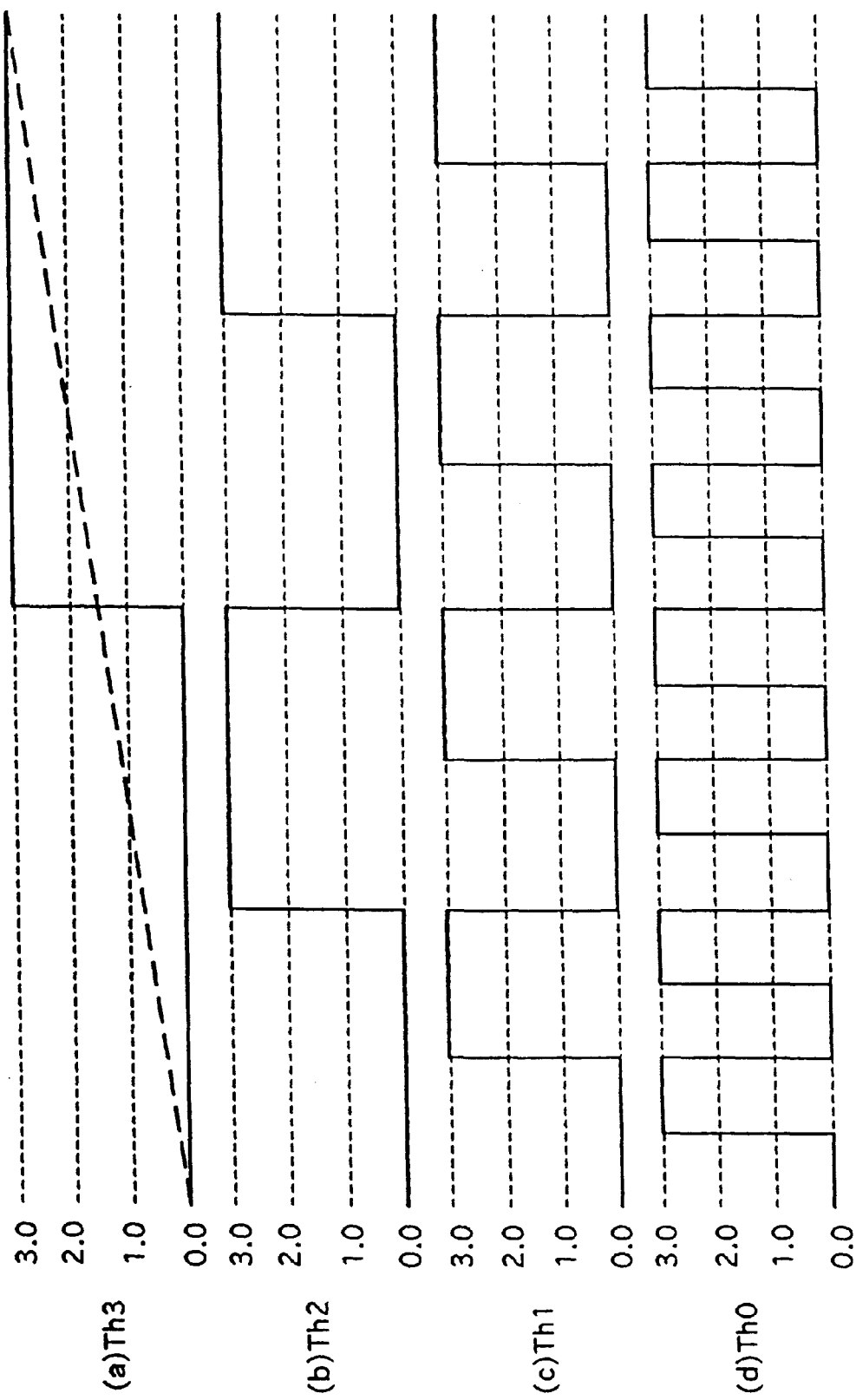
FIG. 3 is a graph showing corresponding to the table in FIG. 2.

As mentioned above, the unstable oscillation is prevented by the bi-stable circuits for supplying the output of the first stage inverter INVi1 (i=3 to 0) to the thresholding circuits of the lower bits. FIG. 3 shows output voltages of this embodiment. FIG. 3(a) is the output voltage from the thresholding circuit Th3 corresponding to MSB, (b) is the output from Th2, (c) is the output from Th1 and (d) is the output from Th0. A stable output is obtained.

When the refresh signal REF, MUX1 to MUX3 select Vref so that Vref is impressed to the capacitances C01 to C33. The refresh switches Sr33 to Sr0 are conductive, the first stage inverters INV31 to INV01 of the thresholding circuits Th3 to Th0 are short-circuited. The residual charge in the input capacitances and inverters is cancelled. An accurate conversion is possible.

When the sleep signal SLEEP is high level, the ground voltage GND is input to the reference voltage input terminal instead of the reference voltage. The multi-plexers MUX1 to MUX3 select the reference voltage inputs and the input capacitances are impressed the ground voltage GND. The sleep switches Ss3 to Ss0 are conductive. The inputs of the first stage inverters INV31 to INV01 in the thresholding circuits Th3 to Th0 are connected to the ground voltage GND. The inverters are in the saturated condition so as not to consume electrical power. The supply voltage Vdd may supplied instead of GND.

The unstableness around a predetermined input voltage is prevented as mentioned above. The residual charge is readily cancelled by a simple refresh circuit. The electrical power consumption is decreased by the sleep mode when the A/D converter is unnecessary.

Figure 4A:
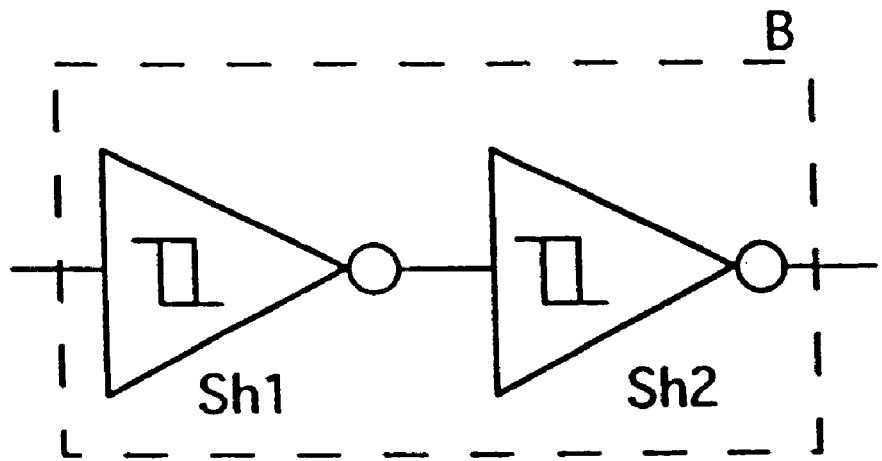
FIGS. 4(a) and (b) are circuit diagrams showing another bi-stable circuit.

The bi-stable circuit is not restricted to be the serial inverters of different thresholds. FIG. 4 shows other bi-stable circuits. The circuit in FIG. 4(a) consists of Schmidt Trigger circuits Sh1 and Sh2 serially connected. This circuit has stable output similarly to the above circuit.

Figure 4B:
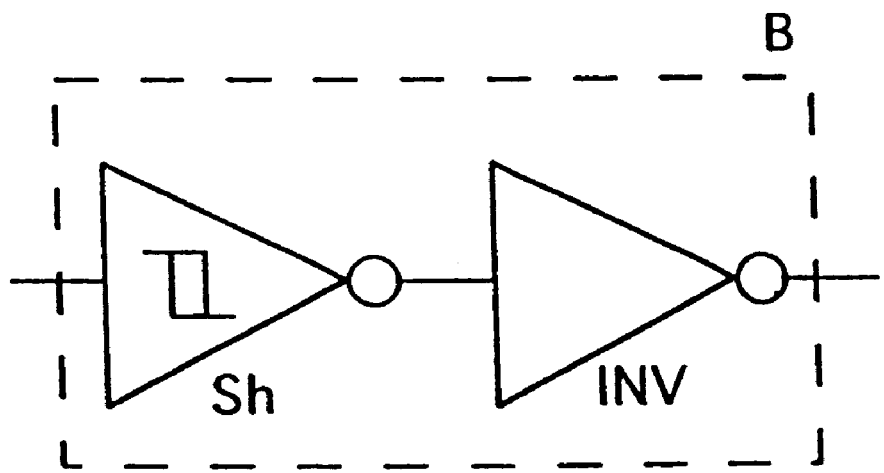

FIG. 4(b) shows a bi-stable circuit consisting of a Schmidt Trigger sh and an inverter INV serially connected. A similar effect can be obtained. The sh is positioned in front of INV in the circuit, the order of the circuits can be reversed. However, the circuit of the previous order is more effective.

The serial circuit of two stages inverter of different thresholds, two stages Schmidt Triggers, one Schmidt Trigger and one inverter and other two stages circuit are described. Any serial circuit of even stages can be applicable.

Figure 19:
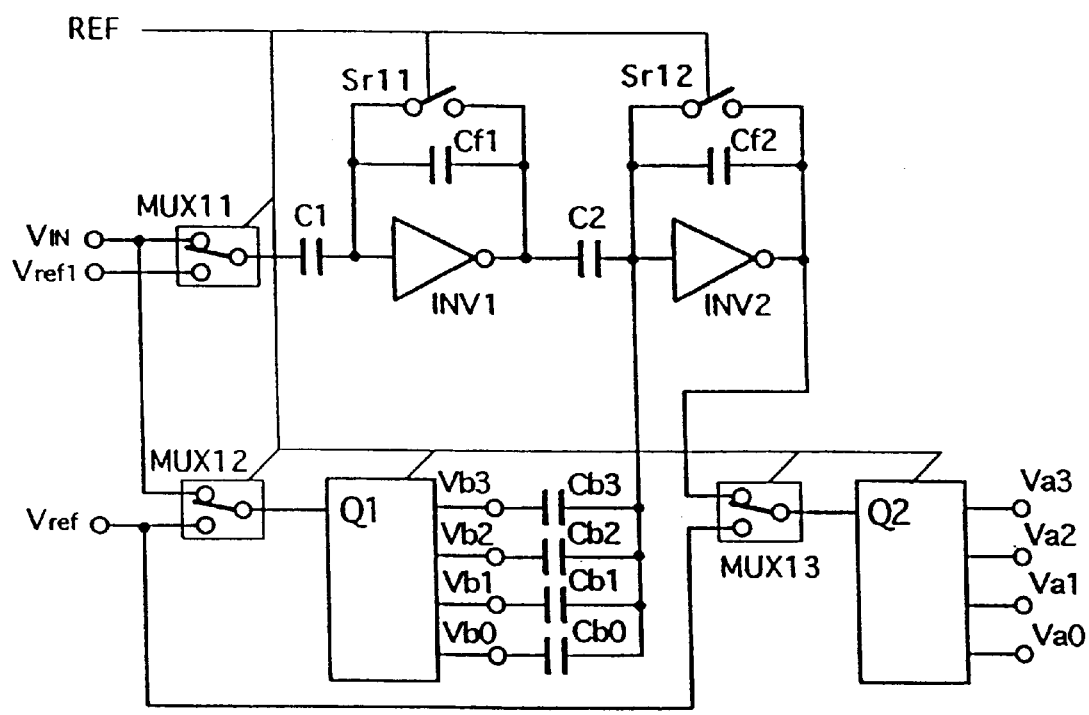
FIG. 19 shows another prior art.
Figure 20:
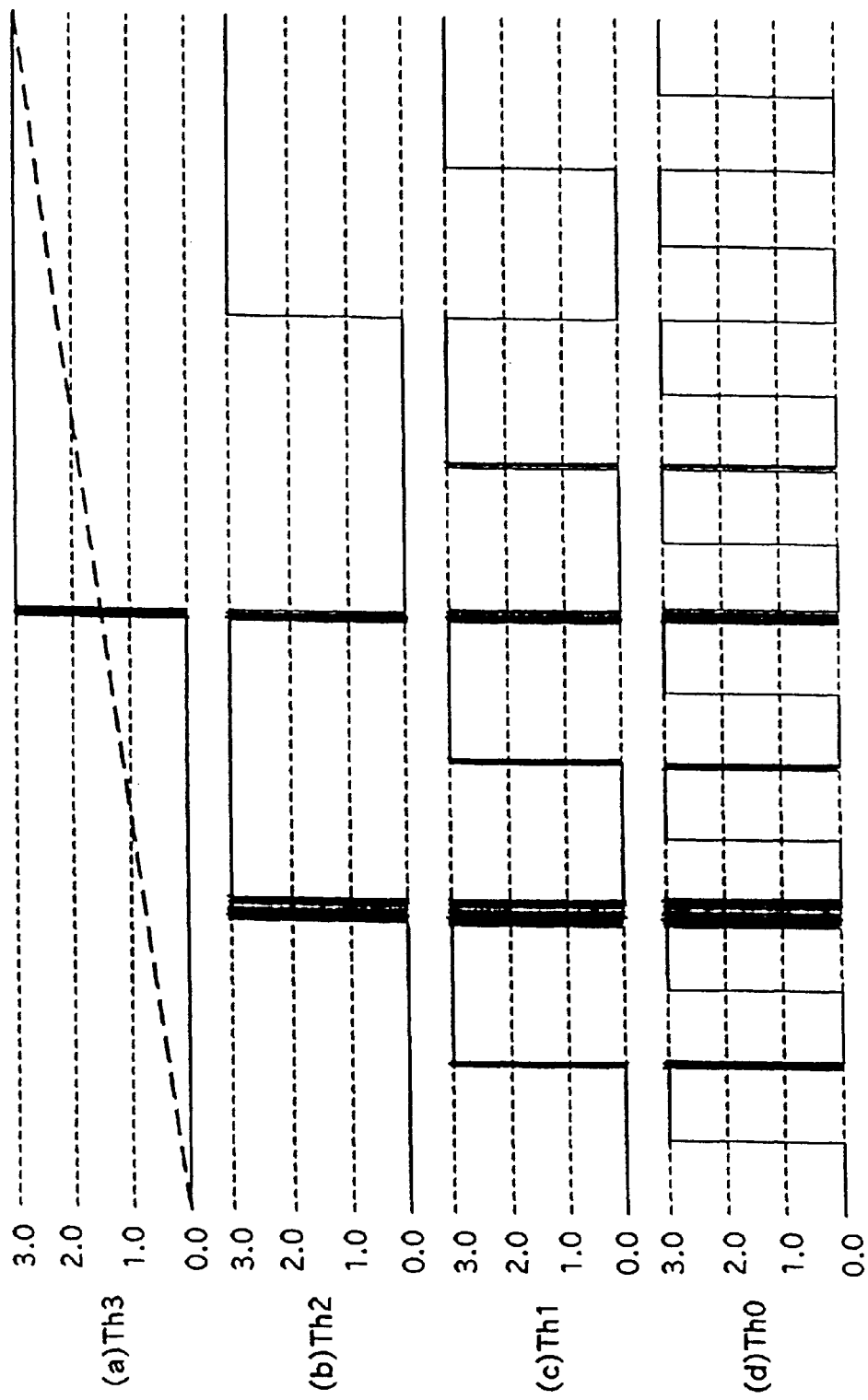
FIG. 20 shows input-output relationship of the circuit in FIG. 19.

Another embodiment is described next with reference to FIG. 5. This circuit corresponds to the A/D converter in FIG. 19. Similar portions to the circuit in FIG. 19 are designated by the same references and descriptions therefor are omitted. The capacitance ratio is the same as that in FIG. 19.

Figure 5:
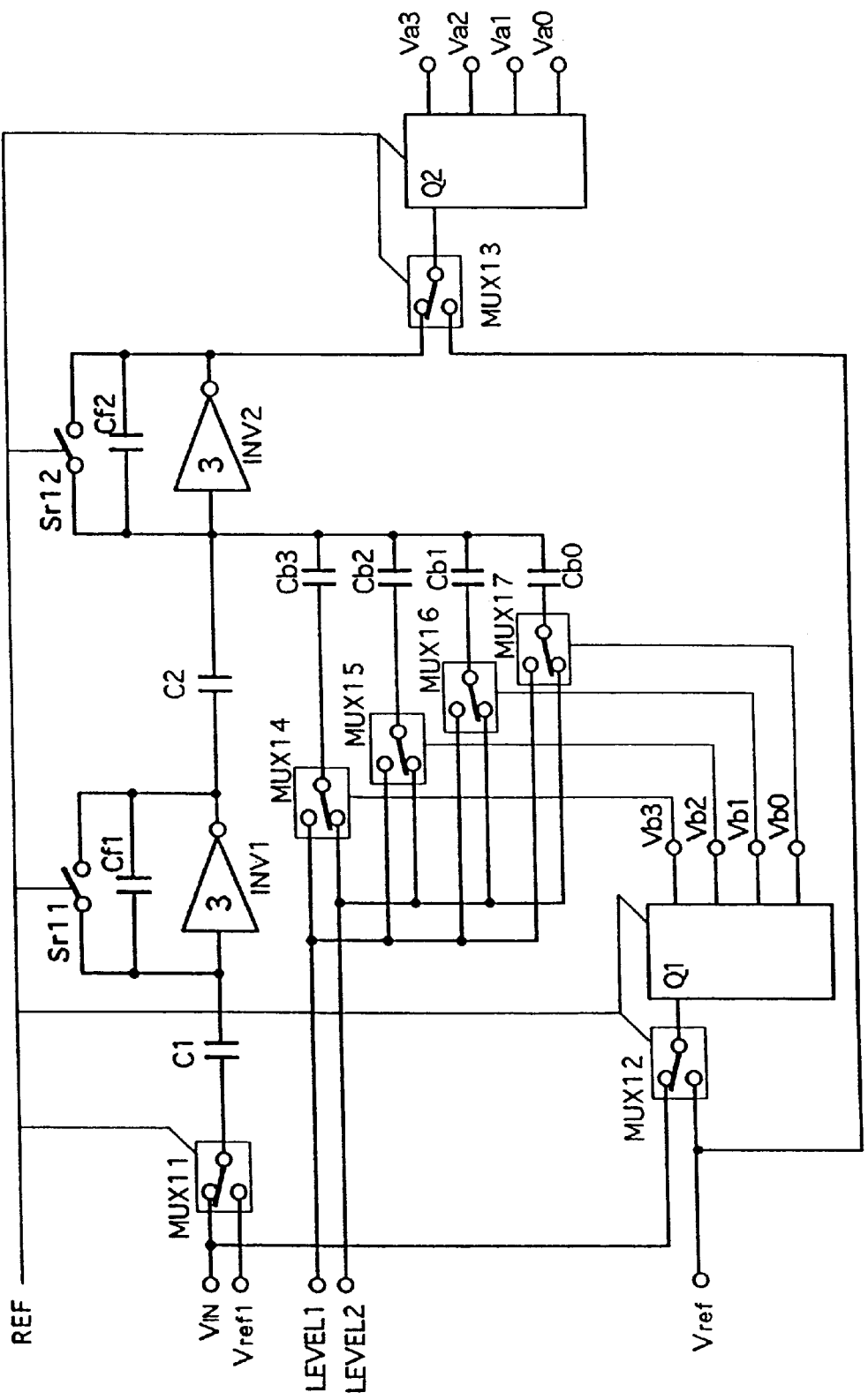
FIG. 5 shows the second embodiment of the present invention.

In FIG. 5, there are provided quantizing circuits Q1 and Q2 of A/D converter circuits shown in FIG. 1. MUX14 and MUX17 are multi-plexers connected to the capacitances Cb3 to Cb0. One input of each multi-plexer is connected to the first level voltage LEVEL1, the other is connected to the second level voltage LEVEL2. The output Vb3 of MSB in the first quantizing circuit Q1 is input as a control signal to the multi-plexer MUX14. The output Vb2 of the second bit is input to MUX15 as a control signal, Vb1 of the first bit is input to MUX16, Vb0 of the 0th bit is input to MUX17. The outputs from Q1 are not directly input to the capacitances, but LEVEL1 and LEVEL2 are input to the capacitances. An A/D conversion of an input voltage of full range from LEVEL1 to LEVEL2.

The unstable output is prevented at a predetermined input by the A/D converter of the first embodiment.

Figure 6:
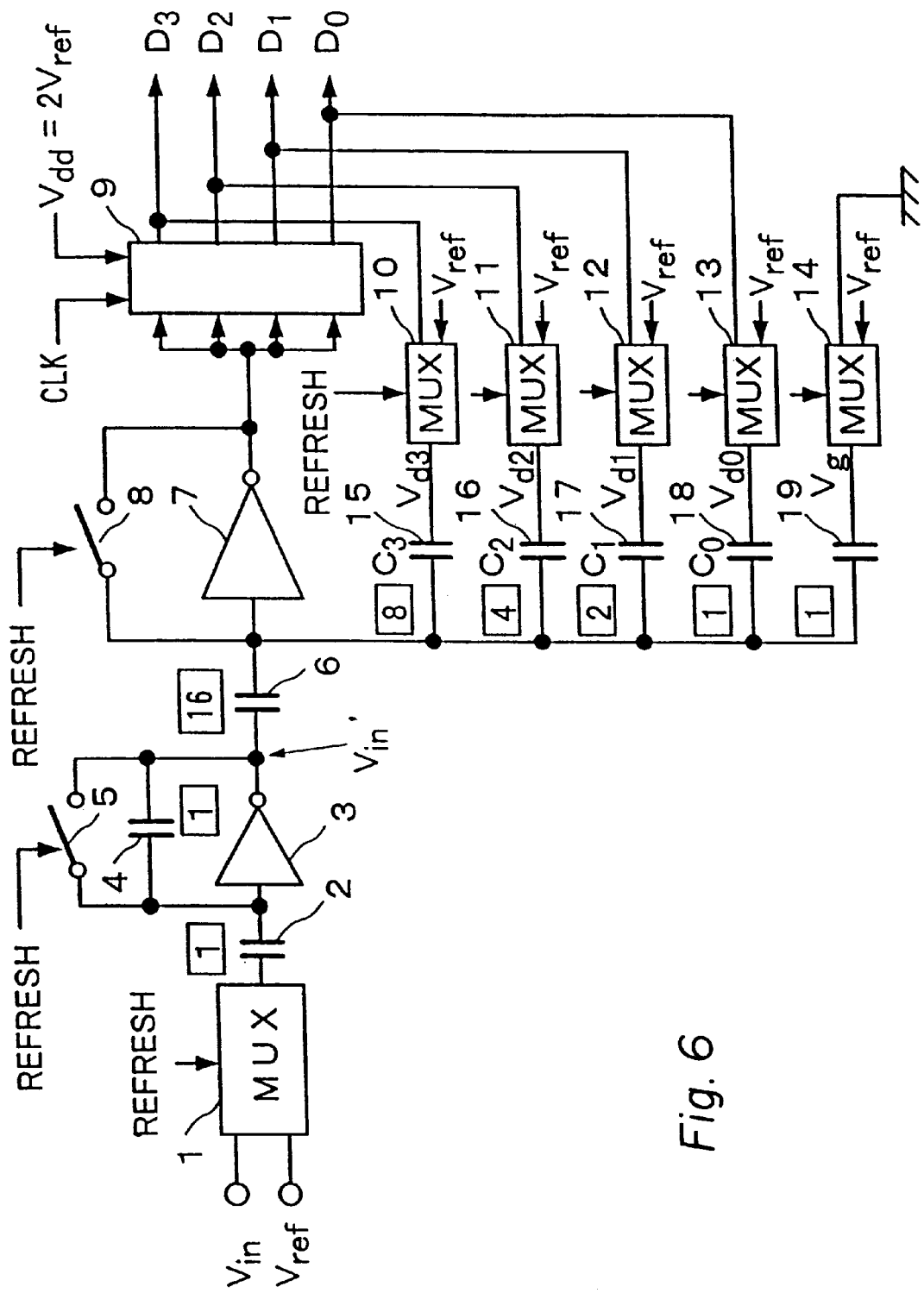
FIG. 6 is a block diagram of the third embodiment.

FIG. 6 shows a sequential type A/D converter as the third embodiment of the present invention.

In FIG. 6, there is provided a multi-plexer 1, an input capacitance 2, a complementary metal-oxide-semiconductor (CMOS) 3, a feedback capacitance 4, a switch 5, an input capacitance 6, a CMOS inverter 7, a switch 8, a control circuit 9, multi-plexers 10 to 14, capacitances 15 to 18 for controlling thresholds, a capacitance 19 for adjusting threshold.

The A/D converter converts an analog input voltage Vin into 4 bits digital data. The input voltage Vin is sampled and held for keeping the input voltage constant during one A/D converting cycle. The CMOS inverter 3 works as a inverting amplifier as mentioned below. The analog input voltage Vin is reversed by the CMOS inverter with respect an axis of the reference voltage Vref to be input to the CMOS inverter 7 as an input voltage Vin'.

The CMOS inverter compares the input voltage with the reference voltage Vref. The input voltage Vin' at an output of the CMOS inverter 3 is input through the input capacitance 6 to the CMOS inverter 7. The control circuit 9 includes a successive approximation register (SAR) for generating a digital output corresponding to Vin' by successively comparing the input Vin' with a registered value in the SAR. Each bit of an output of the SAR is supplied through the capacitances 15 to 18 to the input of the comparator 7. The ground voltage is connected through the capacitance 19 to the input of the CMOS inverter 7.

The CMOS inverter 7 has a constant logical threshold as a boundary of the input voltage at which the output voltage is changed from a high level to a low level and vice versa. However, a threshold for the input voltage Vin' can be controlled by inputting the output from the SAR through capacitances with different capacities to the input of the CMOS inverter 7. A digital data is output from the CMOS inverter 7. The SAR successively and repeatedly changes outputs so as to converges the output to a digital data of four bits corresponding to the input. When fifteen ($2^n-1$) thresholds are set, the input is classified into sixteen levels corresponding to four bit binary number. In this embodiment, sixteen ($2^n=16$) thresholds are defined from Vref/8 to 16Vref/8.

The comparison operation is started after the refreshment for discharging unexpected electrical charge in the capacitances due to leak current etc. The multi-plexers 1, 10 to 14 and switches 5 and 8 are provided for the refreshment. Each of the switches 5 and 8 consists of a plurality of metal-oxide-semiconductor field-effect transistor (MOSFET).

Since the CMOS inverter 7 connected through capacitances 2 and 6 is the main portion of this embodiment, the circuit size is small and the electrical power consumption is low. The CMOS inverter is described more detailedly later. The logical threshold is designed to be a half of the supply voltage Vdd, and Vref is set to be equal to this threshold. The CMOS inverter can be substituted by other comparators such as a comparator of an operational amplifier or a differential-input-positive-feedback comparator in FIG. 14.

The analog input voltage Vin and the reference voltage Vref are input to the multiplexer 1. When the refresh signal REFRESH is generated, the multiplexer 1 selectively outputs Vref and otherwise outputs Vin. The output of the multi-plexer 1 is input through the input capacitance 2 to the CMOS inverter 3. A feedback capacitance 4 and a switch 5 are parallelly connected between the input and output of the CMOS inverter 3. The capacity ratio of the input capacitance and the feedback capacitance is 1:1. The output of the CMOS inverter 3 is input through the input capacitance 6 to the CMOS inverter 7 as a comparator.

A switch 8 is connected between the input and output of the CMOS inverter 7. An output of the CMOS inverter 7 is input to the control circuit 9. The control circuit stepwisely works in response to a clock signal CLK so as to generate parallelly digital bits which are supplied through the multi-plexers 10 to 13 to the capacitances 15 to 18 for determining the threshold of the CMOS inverter 7. The outputs of the multi-plexers 10 to 13 and the multiplexer 14 connected to the ground are input through the capacitances 15 to 18 to the input of the CMOS inverter 7. The multi-plexers 10 to 14 output the reference voltage Vref when REFRESH is generated and otherwise output the output of the SAR. The capacity ratio of the input capacitance 6 and 15 to 18 is 16:8:4:2:1:1.

The capacitances are refreshed before the A/D conversion is performed. The multi-plexer 1 is switched by REFRESH so as to input Vref to the input capacitance 2. Simultaneously, the input and output of the CMOS inverter 3 is short-circuited by the switch 5. The electrical charge in the capacitances 2 and 4 are cancelled. Vref is also input to the input of the input capacitance 6. The CMOS inverter 7 is short-circuited by the switch 8 when REFRESH is input. The multi-plexers 10 to 14 are switched so as to output Vref to the capacitances 15 to 19. The electrical charge in the capacitances are cancelled.

Figure 12:
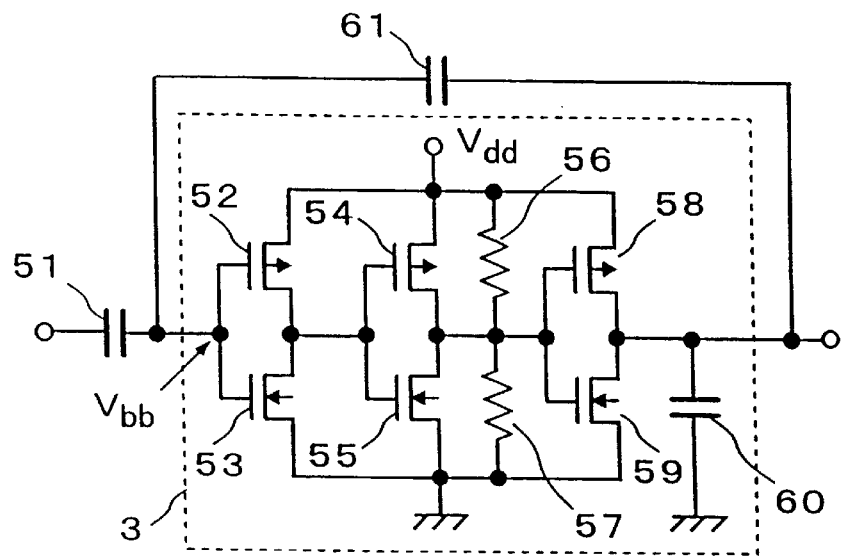
FIG. 12 is a circuit diagram of the CMOS inverter 3 in FIG. 8.

As shown in FIG. 12, the CMOS inverter 3 consists of three stages CMOS inverters serially connected and works in an amplification area. The input of the CMOS inverter 3 is of a voltage equal to the logical threshold (=Vref) when the input is floated or insulated from the power source. Vref is designed to be equal to Vdd/2.

When the capacities of the input capacitance 2 and the feedback capacitance 4 are Cin and Cr, the analog input voltage is Vin and the output voltage is Vout, the following formula 0 expressing the preservation of the electrical charge is given. Here, the electrical charge is zero.

$$Cin(Vin-Vref)+Cf(Vout-Vref)=0 \quad (37)$$

Since Cin=Cf, the formula (37) is simplified as follows.

$$(Vout-Vref)=-(Vin-Vref) \quad (38)$$

The Vin and Vout have equal absolute values and opposite polarity to each other relative to the reference voltage Vref. An inverting amplifier by an operational amplifier can also be used. The operational amplifier may have an input resistance and a feedback resistance instead of capacitances. The CMOS inverter with the capacitance coupling is lowest in the electrical power consumption.

Figure 13:
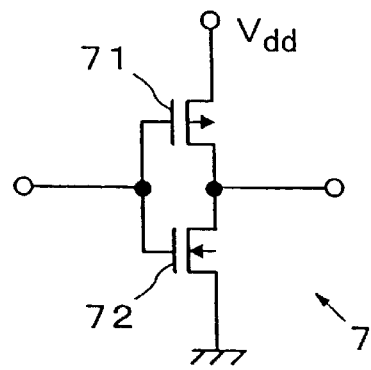
FIG. 13 is a circuit diagram of the CMOS inverter 7 in FIG. 8.

As shown in FIG. 13, the CMOS inverter 7 consists of one CMOS inverter. The input of the CMOS inverter 7 is of a voltage equal to the logical threshold (=Vref) when the input is floated or insulated from the power source. Vref is designed to be equal to Vdd/2.

The capacities of the input capacitance 6, capacitances 15 to 19 are Cin, C3, C2, C1, C0 and Cg, the analog input voltage is Vin' and the output voltages of the outputs D3 top D0 of the control circuit 9 are Vd3 to Vd0. The following formula (39) expressing the preservation of the electrical charge is given. Here, the electrical charge is zero.

$$Cin(Vin'-Vref)+C3(Vd3-Vref)+C2(Vd2-Vref)+C1(Vd1-Vref)+Co(Vd0-Vref)+Cg(0-Vref)=0 \quad (39)$$

Since Cin:C3:C2:C1:C0:Cg=16:8:4:2:1:1, the formula (39) is simplified as follows.

$$Vin' - Vref = -\frac{Vd3 - Vref}{2} - \frac{Vd2 - Vref}{4} - \frac{Vd1 - Vref}{8} - \frac{Vd0 - Vref}{16} - \frac{0 - Vref}{16} \quad (40)$$

When Vd3, Vd2, Vd1 and Vdo have predetermined values and Vin' satisfies the formula (40), the input and output of the CMOS inverter are Vref. When Vin' is higher than the voltage determined by the formula (40), the output of the CMOS inverter 7 becomes lower than the reference voltage Vref to be substantially equal to the ground voltage (0V). When Vin' is lower than the voltage determined by the formula (40), the output of the CMOS inverter 7 becomes higher than the reference voltage Vref to be substantially equal to the supply voltage Vdd. The input voltage Vin' satisfying the formula (40) is a functional threshold voltage Vth of the comparator.

The functional threshold is expressed by the formula (41) from the formula (40).

$$Vth = \frac{32Vref - (8Vd3 + 4Vd2 + 2Vd1 + Vd0)}{16} \quad (41)$$

The outputs D3 to D0 are Vdd=2Vref when these bits are "1", and are the ground voltage (0V) when the bits the outputs D3 to D0 are "0". These voltage levels correspond to symmetrical voltages with respect to an axis of Vref.

FIG. 7 shows the functional threshold of the CMOS inverter 7 determined by the control circuit 9. The values of Vth is shown with respect to the total digital bits of D3, D2, D1 and D0. Vth is the maximum value of 16Vref/8=2Vref=Vdd when (D3, D2, D1, D0)=(0,0,0,0). Vth is the minimum value of Vref/8=Vdd/16 when (D3, D2, D1, D0)=(1,1,1,1). The quantizing step is equal to the minimum threshold, that is, LSB.

When D3, D2, D1, D0) converges to (0,0,0,0) after the successive comparison, 15Vref/8<Vin'<16Vref/8. When (D3, D2, D1, D0) converges to (1,1,1,1), 0<Vin'<Vref/8. The classification of 16 classes between 0<Vin'<2Vref of the input voltage is represented by the four bits digital data. The output is symmetrically reversed with respect to Vref. Vin' is a reversal of Vin with respect to Vref.

The circuit in FIG. 6 of four bits is generalized to be n bits as in the formula (42).

$$Cin(Vin'-Vref)+C_{n-1}(Vd_{n-1}-Vref)+C_{n-2}(Vd_{n-2}-Vref)+ \ldots +C_1(Vd_1-Vref)+C_0(Vd0-Vref)+Cg(0-Vref)=0 \quad (42)$$

When the capacities of the capacitances $C_{n-1}$ to $C_0$ correspond to the weights of the outputs in the control circuit 9, integer i=1 to n, $Cg=C_0$, and $$C_{i-1}=2^{i-1}C_0$$

$$Cin=2^nC_0(=C_{n-1}+C_{n-2}+ \ldots +C_1+C_0+C_0)$$

Then, the following formula is given.

$$Vin' - Vref = -\frac{Vd_{n-1} - Vref}{2} - \frac{Vd_{n-2} - Vref}{4} - \frac{Vd_{n-3} - Vref}{8} \cdots - \frac{Vd_0 - Vref}{2^n} - \frac{0 - Vref}{2^n} = 0 \quad (43)$$

In this generalized embodiment, Vin' i.e. the functional threshold Vth=2Vref=Vdd when the total outputs $D_{n-1}$ to $D_0$ are "0" and $Vd_{n-1}=Vd_{n-2}= \ldots =Vd_0=0$. Vin' i.e. the functional threshold Vth=Vref/$2^{n-1}$=Vdd/$2^n$ when the total outputs $D_{n-1}$ to $D_0$ are "1" and $Vd_{n-1}=Vd_{n-2}= \ldots =Vd_0=$ 2Vref.

The capacity ratio of the capacitances Cin, 15 to 18, C3 to C0 and Cg are set proportional so that the input voltage between 0V and Vdd is proportional to the digital output. However, other capacity ratio can be applied for other A/D conversion.

The functional threshold Vth is linearly changed by adjusting the capacity of the capacitance 19, then the relationship between the analog input and the digital output is parallelly shifted. This adjustment is also possible by changing the voltage impressed to the capacitance 19. The capacitance can be removed.

Figure 8:
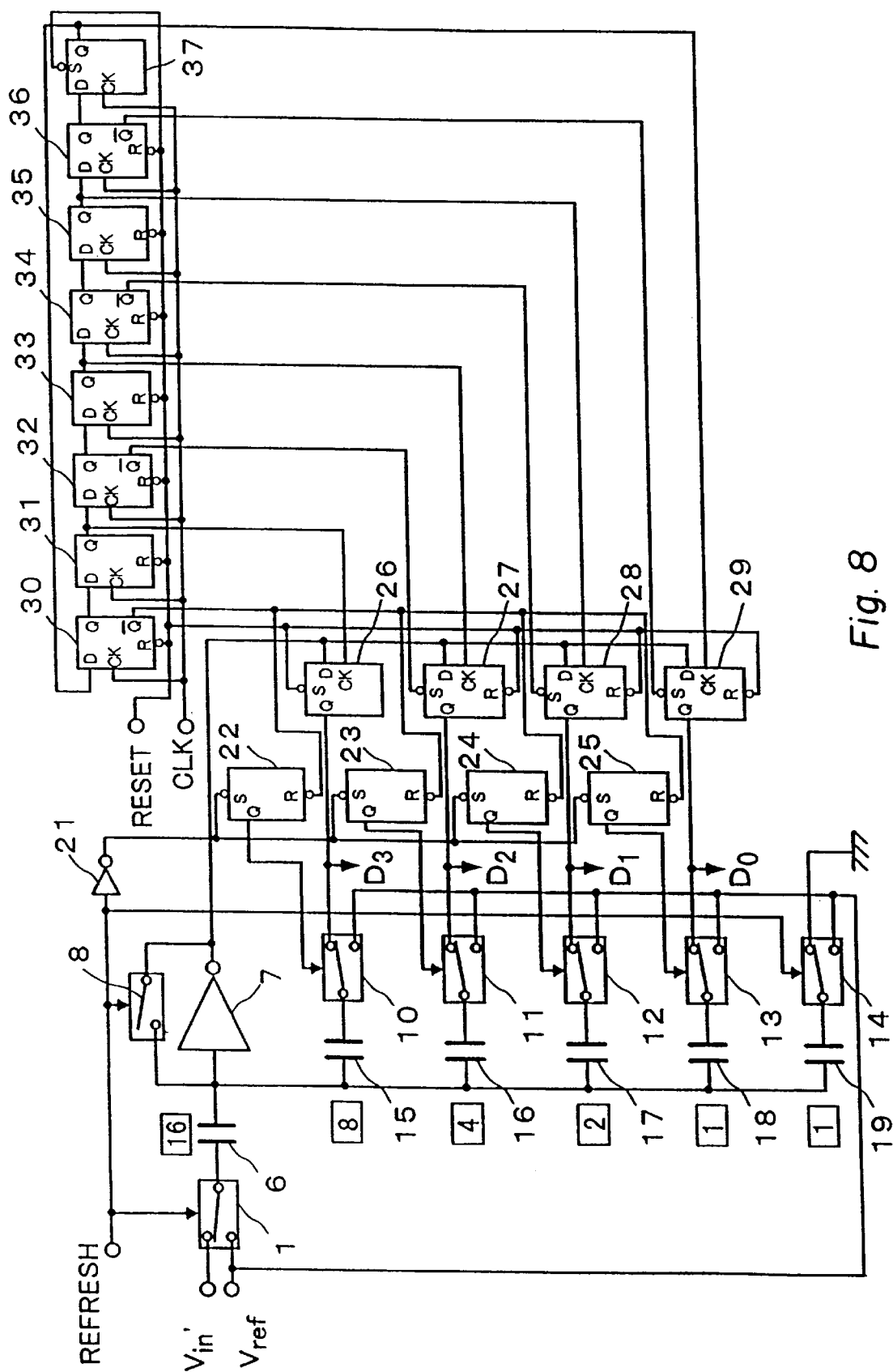
FIG. 8 is a circuit diagram of the embodiment of FIG. 6.

FIG. 8 is a circuit diagram showing main portions of the circuit with omitting the front portions including CMOS inverter 3. Similar portions to those in FIG. 1 are designated by the same references and descriptions therefor are neglected. There are provided an inverter 21, RS flip-flops 22 to 25 and D flip-flops 26 to 37. I/O terminals not connected to functional signals are neglected in the flip-flops. These terminals are connected to the supply voltage etc. for performance stability.

The RS flip-flops 22 to 25 supply the reference voltage Vref through the multi-plexers 10 to 13 to the capacitances 15 to 18 for refreshing the capacitances. The SAR mainly consists of D flip-flops 26 to 29 which output digital data D3 to D0 and input the supply voltage Vdd=2Vref or 0V through the multi-plexers 10 to 13 to the capacitances 15 to 18. D flop-flops 30 to 37 construct a ripple counter for outputting one bit high level signal among a plurality of bits (8 bits in FIG. 8). The ripple counter controls the Rs flip-flops 22 to 25 and the D flip-flops 26 to 29. The multi-plexer 14 connects the ground voltage GND or the reference voltage to the capacitance 19.

The refresh signal REFRESH is connected through the inverter 21 to set terminals S of the RS flip-flops. Reset terminals R of the RS flip-flops 22 to 25 are connected to inverted output terminals Q of D flip-flop 30. Output terminals of the SR flip-flops 22 to 25 are connected to control terminals of the multi-plexer 10 to 13, respectively.

The D flip-flop 26 has at least a set terminal S. D flip-flops 27 to 29 have set terminals S and reset terminals R. The reset signal RESET is connected to the reset terminals R of the D flip-flops 27 to 29. The set terminals S of the D flip-flops 27 to 29 are connected to inverted output terminals Q of the D flip-flops 32, 34 and 36, respectively. The D flip-flops are successively switched to be "1" compulsorily. D input terminals of the D flip-flops 26 to 29 are commonly connected to the output of the CMOS inverter. Clock input terminals of the D flip-flops 26 to 29 are non-inverted Q output terminals of the D flip-flops 31, 33, 35 and 37 for successively fetching the output of the CMOS inverter 7.

The D flip-flops 30 to 36 have at least reset terminals R and D flip-flop 37 has at least a set terminal S. The reset signal RESET resets the D flip-flops 30 to 36 as well as sets the D flip-flop 37. D flip-flops 30 to 36 are serially connected so that the non-inverted output Q of each flip-flop is transferred to the D input of the next flip-flop. The output Q of the last stage flip-flop 37 is connected to the D input of the first stage flip-flop 30. The clock signal CLK is commonly input to the flip-flops 30 to 37. The flip-flop 37 is set to be "1" at the Q output by RESET first. The output is circulated through the flip-flops 30 to 37. The flip-flops works as a ripple counter for controlling working timing of the RS flip-flops 22 to 25 and D flip-flops 26 to 29.

Figure 9:
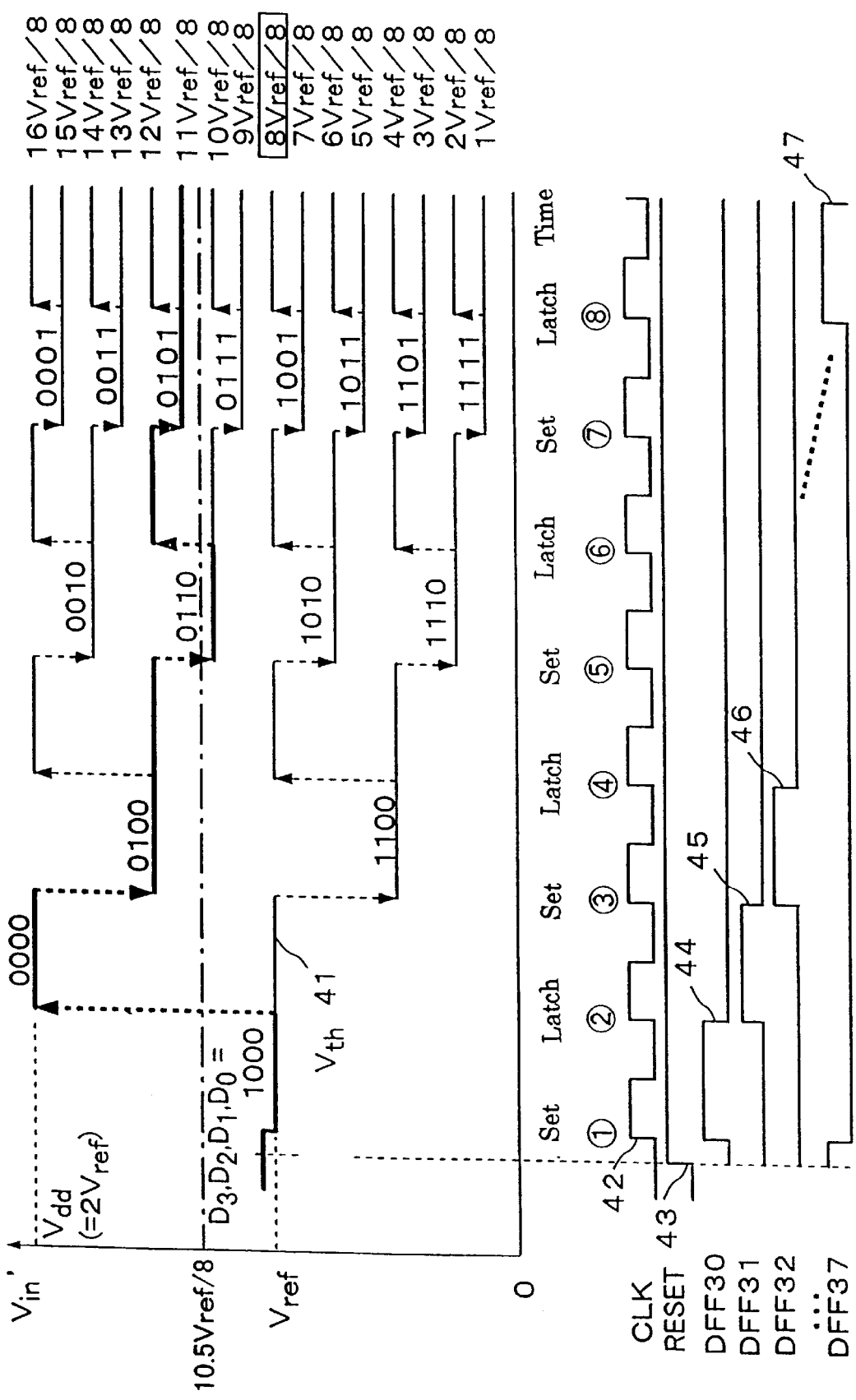
FIG. 9 a diagram showing signals in the third embodiment.

FIG. 9 has two diagrams, an upper one and lower one, for describing the performance of the circuit in FIG. 3. In the upper diagram, a vertical axis represents the analog input voltage and a horizon axis represents "time". The functional threshold of the CMOS inverter 7 as a comparator is shown for the total cases. A thick line shows an exemplary case. The lower is a wave diagram of signals of circuits. The functional threshold Vth is shown by "41", the clock CLK by "42", the reset signal RESET by "43" and the outputs from the D flip-flops 33 to 36 in FIG. 3 by "44" to "47". The outputs of the D flip-flops 33 to 36 are not shown. The refreshing condition is not shown. Hereinafter, the performance is described when the input voltage Vin' is 10.5Vref/8.

On completing the refresh, the functional threshold Vth=17/Vref/16 because Vref is impressed through the multi-plexers 10 to 13 to the capacitances 15 to 18 and the ground voltage is impressed through the multi-plexer 14 to the capacitance 19, before RESET is changed to "0".

When RESET becomes "0", the D flip-flop 26 is set and D flip-flops 27 to 29 are reset. Then, (D3, D2, D1, D0)= (1000). Since the multi-plexer 10 to 13 are not switched, the functional threshold 41 is not changed.

At the timing ① of the leading edge of the first clock CLK after RESET returns to "1", the inverted output Q of the D flip-flop 30 becomes "0", the RS flip-flops 22 to 25 are reset and the multi-plexers 10 to 13 are switched. In response to D3 to D0 (=1000), Vdd=2Vref is input to the capacitance 15 and the ground voltage is input to the capacitances 16 to 18. The capacitance 19 is always supplied with the ground voltage except when it is refreshed. The functional threshold 41 is Vref. Since Vin'=10.5Vref/8, the output of the CMOS inverter 7 is less than Vref. The inputs of the D flip-flops 26 to 29 are zero.

At the next timing ② of the leading edge of the clock CLK, the inverted Q output terminal of the D flip-flops 30 is "1" and the non-inverted Q output terminal of the D flip-flop 31 becomes "1". The D flip-flops 26 fetches or latches the value "0" of the D input. Then, the D flip-flops 26 to 29 output (0000), the functional threshold is 16Vref/8=Vdd. The output of the CMOS inverter 7 exceeds Vref and the input terminals of the D flip-flops 26 to 29 becomes "1".

At the next timing ③ of the leading edge of the clock CLK, the non-inverted Q output terminal of the D flip-flops 31 returns to "0" and the inverted Q output terminal of the D flip-flop 32 becomes "0". The D flip-flop 27 is set, the outputs of the D flip-flops 26 to 29 are (0100), the functional threshold is 12Vref/8=Vdd as shown in FIG. 7. The output of the CMOS inverter 7 exceeds Vref and the input terminals of the D flip-flops 26 to 29 are kept "1", when Vin'= 10.5Vref/8.

At the next timing ④ of the leading edge of the clock CLK, the inverted Q output terminal of the D flip-flops 32 returns to "1" and the non-inverted Q output terminal of the D flip-flop 33 becomes "1". However, the D flip-flop 27 fetches the value "1" of the D input, the status of the D flip-flop 27 is not changed. The outputs of the D flip-flops 26 to 29 are (0100), so the functional threshold is kept unchanged.

At the next timing ⑤ of the leading edge of the clock CLK, the non-inverted Q output terminal of the D flip-flops 33 returns to "0" and the inverted Q output terminal of the D flip-flop 34 becomes "0". The D flip-flop 28 is set, the outputs of the D flip-flops 26 to 29 are (0110), the functional threshold is 10Vref/8=Vdd. The output of the CMOS inverter 7 is less than Vref and the input terminals of the D flip-flops 26 to 29 are "0", when Vin'=10.5Vref/8.

At the next timing ⑥ of the leading edge of the clock CLK, the inverted Q output terminal of the D flip-flops 34 returns to "1" and the non-inverted Q output terminal of the D flip-flop 35 becomes "1". The D flip-flop 28 fetches the value "0" of the D input. The outputs of the D flip-flops 26 to 29 are (0100).

At the next timing ⑦ of the leading edge of the clock CLK, the non-inverted Q output terminal of the D flip-flops 35 returns to "0" and the inverted Q output terminal of the D flip-flop 36 becomes "0". The D flip-flop 29 is set, the outputs of the D flip-flops 26 to 29 are (0101), the functional threshold is 11Vref/8=Vdd. The output of the CMOS inverter 7 exceeds Vref and the input terminals of the D flip-flops 26 to 29 are "1", when Vin'=10.5Vref/8.

At the next timing ⑧ of the leading edge of the clock CLK, the inverted Q output terminal of the D flip-flops 36 returns to "1" and the non-inverted Q output terminal of the D flip-flop 37 becomes "1". The D flip-flop 29 fetches the value "0" of the D input. The outputs of the D flip-flops 26 to 29 are kept (0101).

Then, one cycle A/D conversion is finished. The conversion outputs D3, D2, D1 and D0 of (0101) are output from the D flip-flops 26 to 29. The output means that the analog input Vin' is more than 10Vref/8 and less than 11Vref/8. When the analog input signal Vin' is equal to or more than 0V and less than 16Vref/8, the functional threshold Vth (41) is one of the sixteen values as shown in the figure.

The next analog input voltage Vin is input to the multiplexer 1, then RESET is input. The circuit works repeatedly in response to the clock signal CLK similarly to the above. The new analog input voltage is converted from analog to digital. The circuit may be refreshed at intervals between successive cycles of A/D conversion. Though, the A/D conversion outputs D3 to D0 are taken from the non-inverted Q output of the D flip-flops 26 to 29 in the above embodiment, they can be taken from the multi-plexers 10 to 13 or from inverted Q output (not shown).

In the circuit of FIG. 8, the data fetch of the comparison result by the CMOS inverter 7 and "1" setting for judgment of the next bit are performed one after another. Only one bit among D3 to D0 can be changed, so eight clocks cycles are necessary for four bits A/D conversion. The clock cycles may be decreased by the following embodiment.

Figure 10:
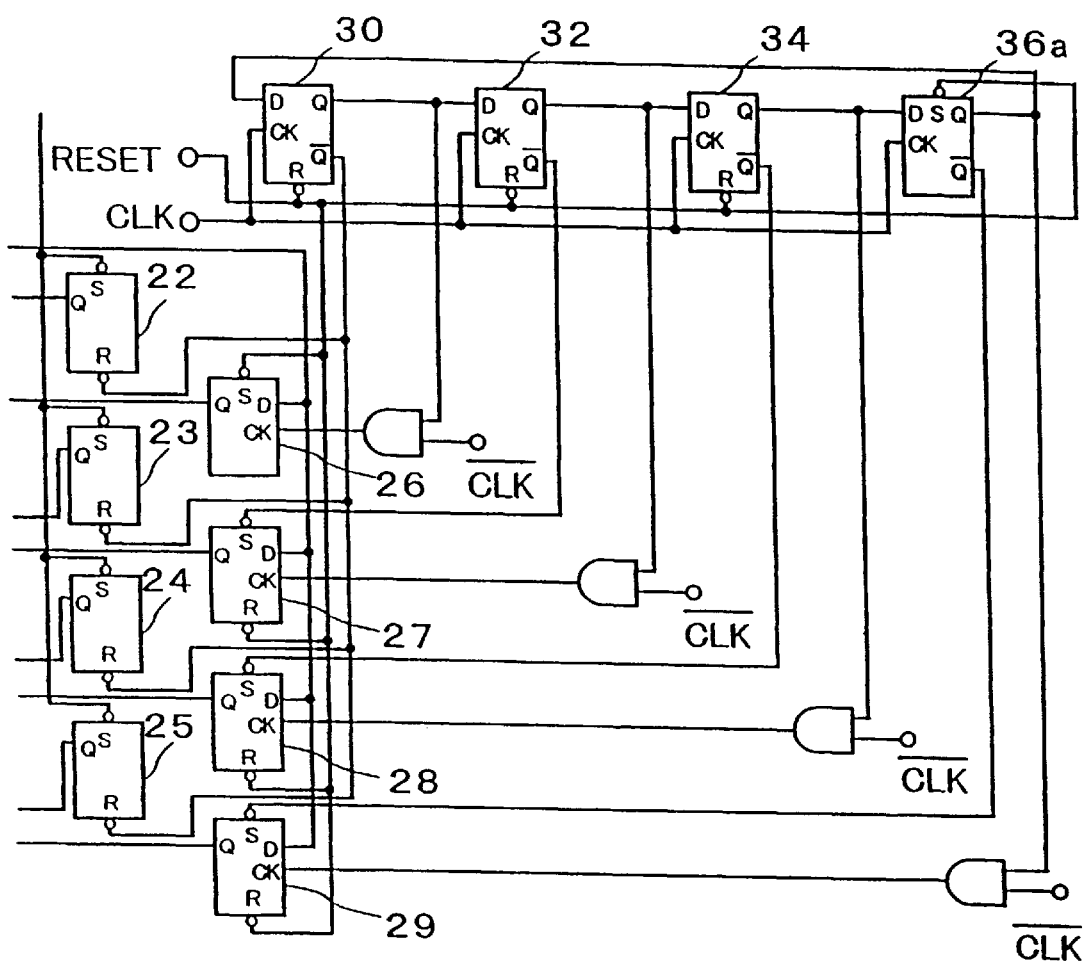
FIG. 10 shows the first variation of the third embodiment.

FIG. 10 shows another embodiment of short A/D conversion cycle. In FIG. 10, similar portions to those in FIG. 8 are designated by the same references and description therefor are omitted. A D flip-flop 36a with a set terminal S instead of the reset terminal is provided. This embodiment works in response to both leading and trailing edges of the clock signal CLK. The data fetch (latch) is performed at the timing of the leading edge, and the compulsory setting of "1" to the next stage is performed at the timing of the trailing edge. The D flip-flop 36a also sets the D flip-flop 37 in FIG. 8.

Figure 11:
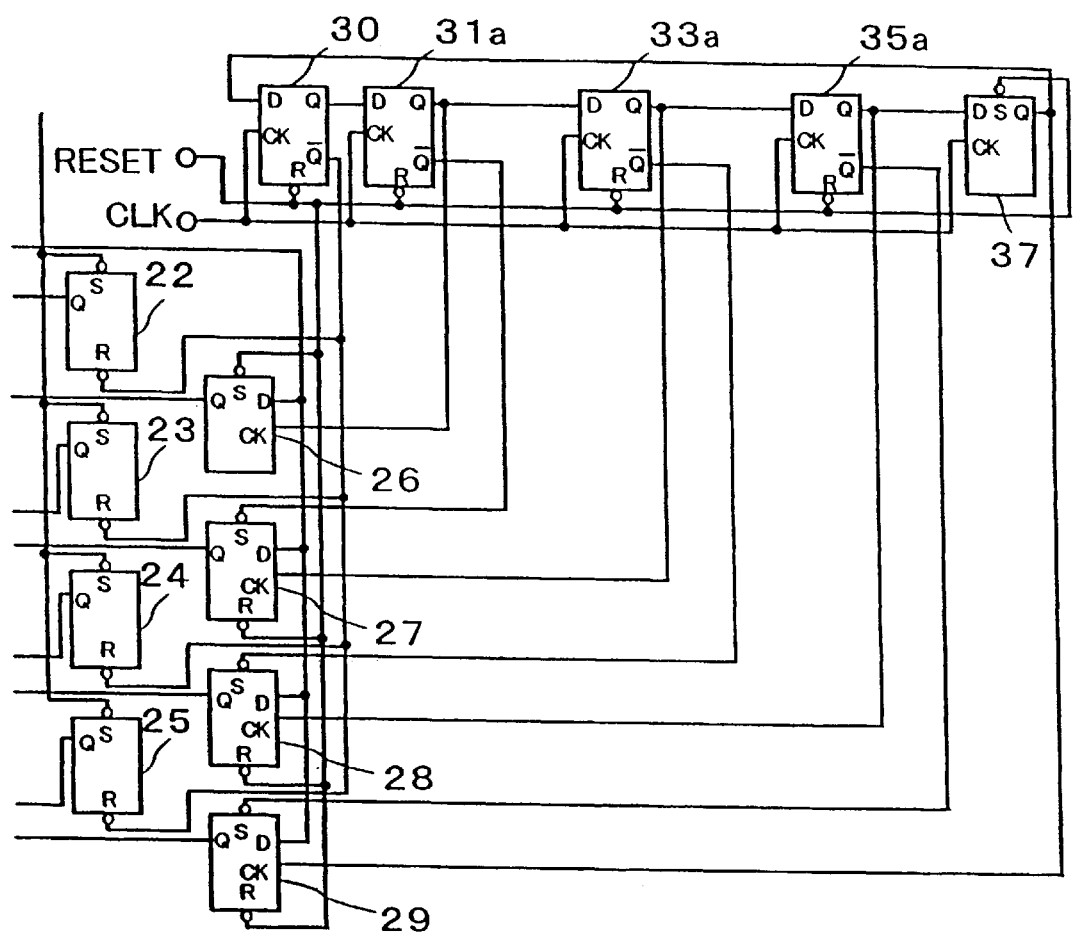
FIG. 11 shows the second variation of the third embodiment.

FIG. 11 is a partial circuit diagram of further another embodiment. Similar portions to those in FIG. 8 are designated by the same references and description therefor are omitted. The D flip-flops 31a, 33a and 35a are similar flip-flops to the flip-flops 31, 33 and 35, but inverted Q outputs are added. The data fetch (latch) and the compulsory setting of "1" to the next stage are simultaneously performed. The number of stages of D flip-flops is decreased to five stages.

At the timing ② of the leading edge of the clock signal CLK, the data fetch of the comparison result by the D flip-flop 26 and the set of the D flip-flop 27 are simultaneously performed. At the timing ③ of the leading edge of the clock signal CLK, the data fetch of the comparison result by the D flip-flop 27 and the set of the D flip-flop 28 are simultaneously performed. At the timing ④ of the leading edge of the clock signal CLK, the data fetch of the comparison result by the D flip-flop 28 and the set of the D flip-flop 29 are simultaneously performed. At the timing ⑤ of the leading edge of the clock signal CLK, the data fetch of the comparison result by the D flip-flop 29.

In FIG. 12, the CMOS inverter 3 includes an input capacitance 51, p-channel MOS FETs (PMOSFETs) 52, 54 and 58, n-channel MOS FETs (NMOSFETs) 53, 55 and 59, resistances 56 and 57, a capacitance 60 for phase adjustment and a feedback capacitance 61. There three pairs of PMOSFET and NMOSFET, 52 and 53, 54 and 55, and, 58 and 59 for constructing complementary MOSFETs (CMOSFETs) as inverters. The CMOS inverter works in the transient area where the output changes from high level to low level or vice versa so as to have a performance of amplifier of high gain. A three stages amplifiers are serially connected.

The input at the point B of the CMOS inverter 3 is of a constant voltage equal to Vref due to high voltage gain. The point B is connected to the capacitances 51 and 61 and PMOSFET 52 and NMOSFET 53, so it is insulated or floating. The capacity is preserved and the capacity is kept zero if the initial capacity is zero. The above formula 37 is given when the capacities of capacitances 51 and 61 are Cin and Cf. The resistances 56 and 57 decreases the gain and the capacitance 61 removes high frequency component of the signal so that unexpected oscillation is prevented.

For the circuit of a single supply voltage, Vref is designed to be Vdd/2 so that the dynamic range of the amplifier is maximized. When two supply voltages of positive and negative polarities, Vref may be zero volt.

FIG. 13 shows the CMOS inverter 7 of one CMOSFET consisting of PMOSFET 71 and NMOSFET 72. The logical threshold is the threshold of the CMOSFET where the output steeply changes from high level to low level and vice verse. The threshold is the reference voltage Vref. Vref=Vdd/2 in the single supply voltage circuit.

The CMOS inverter 7 can be substituted by a differential input positive feedback comparator is shown in FIG. 9. There are PMOSFETs 81, 83, 84, 85 and 89, and NMOSFETs 82, 86, 87, 88 and 90. The comparator is differential input type having a positive feedback portion. The gain is rather high. The comparison output is not unstable even when the input is around the threshold.

The supply voltage Vdd is input through the PMOSFET 83 to the PMOSFETs 84 and 85. Drain terminals of PMOSFET 84 and 85 are connected to drain terminals of the NOMOSFETs 87 and 88, respectively. Source terminals of the NMOSFETs 87 and 88 are connected to the ground. Gates of the NMOSFETs 87 and 88 are connected to drain terminals of NOMSFETs 88 and 87, respectively. Drain terminals of PMOSFETs 84 and 85 are connected to the NMOSFET 86. The drain of the PMOSFET 84 is connected to gates of CMOSFET consisting of the PMOSFET 81 and NMOSFET 82. The drain of the PMOSFET 85 is connected to gates of CMOSFET consisting of the PMOSFET 89 and NMOSFET 90. Both of CMOSFETs are supplied with the supply voltage Vdd and the ground voltage.

The PMOSFET 83 is a constant current circuit when a bias voltage is impressed. The current is controlled by changing the bias voltage. The higher the bias voltage is, the faster the working speed is. The working speed can be controlled. The gate terminal of the PMOSFET 84 is a negative input terminal to which the input voltage Vin' is input. The gate terminal of the PMOSFET 85 is a positive input terminal to which the reference voltage is input from a reference voltage generating circuit (not shown).

When the comparator in FIG. 6 is substituted by this comparator, Vref=Vdd/2. NMOSFET 86 is a sleep switch to which the clock signal CLK is input at its gate terminal. NMOSFET 86 can be substituted by a PMOSFET. The CMOSFET of PMOSFET 89 and NMOSFET 90 is a buffer as an output terminal of the comparator.

The comparator outputs an inverted output corresponding to the comparator in FIG. 6. The non-inverted output can be generated. For the non-inverted output, the output is taken from the CMOSFET of PMOSFET 81 and NMOSFET 82, or the connection of the analog input voltage and the reference voltage are reversed. By a non-inverted comparator for the comparator in FIG. 1, the output is high level when Vin' exceeds Vth and is low level when Vin' is less than Vth. This reversed output in comparison with the output of the comparator in FIG. 11 can be reversed by a minor change in logical circuits.

When the clock signal CLK input to the gate of NMOSFET 86 is high level first, the anode and cathode are short-circuited so that the comparator is in the sleep mode. The performance of the circuit is slightly deviated from the symmetry so that the output of PMOSFET 85 is low level and the output terminal OUTPUT is high level. If perfectly symmetric, the output becomes an intermediate voltage, the current flows and the electrical power consumption is large.

At the timing the analog input voltage becomes stable, for example, the output of a previous sampling and holding circuit, the clock input to the gate of the NMOSFET 86 is changed to low level. NMOSFET is opened so that the comparison of Vin' and the reference voltage at the gate terminal of PMOSFET is started.

The output of PMOSFET 83 and 85 becomes floating. When Vin' is a little higher than Vref, the difference between them quickly causes high level of the output of PMOSFET 85 due to the positive feedback loop. When Vin' is slightly lower than Vref, the circuit becomes sleep mode. The output is kept high level. The PMOSFET 81 and NMOSFET 82 are symmetric with the PMOSFET 89 and NMOSFET 90 for good sensitivity of the comparator.

The comparator is highly sensitive due to the positive feedback. A steep change occurs in response to a small input change. A stable output is obtained. However, the sleep operation is necessary before the comparison operation.

Figure 14:
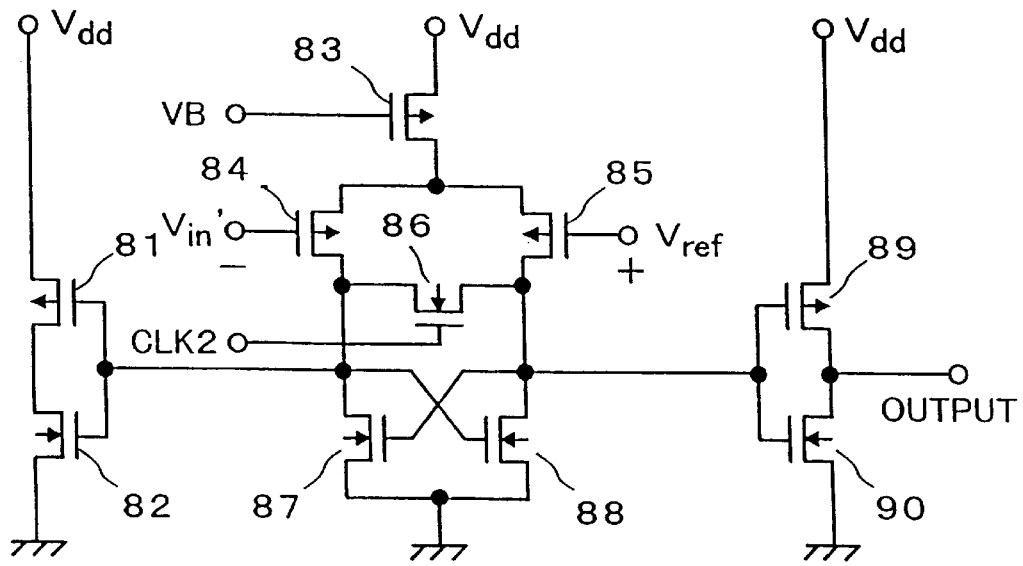
FIG. 14 is a circuit diagram of a differential type input-positive-feedback comparator for substituting the CMOS inverter 7.

As shown in FIG. 13, the comparator in FIG. 14 is higher in gain than CMOS as a comparator, the output is stable even when the input is around the threshold. The switch for short-circuiting the input and output of the inverter 7 is unnecessary.

The phase of the clock signal CLK2 input to the gate of the NMOSFET 86 and the clock signal CLK in FIG. 8 are to be considered for the circuit in FIG. 8 is substituted by the circuit in FIG. 14. The CLK2 should be changed from high level to low level before the comparison output is fetched for the comparison operation.

In the timing chart of FIG. 9, the D flip-flops 26, 27, 28 and 29 fetch are the output of CMOS inverter 7 at the timing ②,④,⑥ and ⑧ of the leading edge of the CLK. The CLK2 changes from high level to low level just before these timings for comparison operation. The clock becomes high level after the comparison output is fetched.

As an example, CLK is divided so that the leading edges occur at the timing between the timing ① and ②, ② and ③, ③ and ④ and so forth.

A clock2 a little advances relative to CLK can be used because the comparison can be performed at the timing of ①,③,⑤, . . . It is also possible to delay CLK.

What is claimed is:

1. An analog to digital converter for generating a digital data of a plurality of bits from a most significant bit (MSB) to a least significant bit (LSB) in response to an analog input voltage comprising:

(a) a plurality of thresholding circuits corresponding to said bits of said digital data, each said thresholding circuit comprising an odd number of inverters serially connected from a first stage to a last stage, said first stage inverter of each said thresholding circuit having a threshold equal to a weight of said corresponding bit;

(b) a plurality of weighting circuits connected to inputs of thresholding circuits of bits other than said MSB, each said weighting circuit receiving said analog input voltage and one or more outputs from said thresholding circuits corresponding to higher bits than said bit corresponding to said weighting circuit, said analog input voltage being weighted by a weight corresponding to said bit of said thresholding circuit, each said output being weighted by a ratio of a weight corresponding to bit of said weighting circuit; and (c) said inverters of said first stage and said last stage having different thresholds.

2. An analog to digital converter as claimed in claim 1, wherein said weighting circuit comprising a capacitive coupling which comprises a plurality of capacitances connected at inputs thereof to said analog input voltage and said outputs from said higher bits, and said plurality of capacitances commonly connected at outputs thereof to said thresholding circuit.

3. An analog to digital converter as claimed in claim 1, wherein said weighting circuit further comprising a plurality of bi-stable circuits controlled by said outputs from said higher bits for alternatively inputting a first level voltage and a second level voltage to said weighting circuit.

4. An analog to digital converter as claimed in claim 3, wherein said first level voltage is a supply voltage of said inverter and said second level voltage is a ground voltage.

5. An analog to digital converter as claimed in claim 1, wherein said odd number of inverters is three.

6. An analog to digital converter as claimed in claim 1, further comprising a plurality of refreshing circuits corresponding to said thresholding circuits for short-circuiting an input and output of said first stage inverters.

7. An analog to digital converter as claimed in claim 1, further comprising a plurality of sleep circuits corresponding to said thresholding circuits for inputting a voltage to said first stage inverters so that said inverters become saturated.

8. An analog to digital converter as claimed in claim 1, wherein each said thresholding circuit further comprising an inverter connected to said last stage inverter for inverting said output of said last stage inverter.

9. An analog to digital converter as claimed in claim 3, wherein each said bi-stable circuit comprising an even number of Schmidt Trigger circuits serially connected.

10. An analog to digital converter as claimed in claim 9, wherein each said bi-stable circuit comprising a Schmidt Trigger circuit and an inverter circuit serially connected.

11. An analog to digital converter comprising:

a first analog to digital converter for generating a distal data of a plurality of bits from a most significant bit (MSB) to at least significant bit (LSB) in response to an analog input voltage comprising:
  (a) a plurality of thresholding circuits corresponding to said bits of said digital data, each said thresholding circuit comprising an odd number of inverters serially connected from a first stage to a last stage, said first stage inverter of each said thresholding circuit having a threshold equal to a weight of said corresponding bit;
  (b) a plurality of weighting circuits connected to inputs of thresholding circuits of bits other than said MSB, each said weighting circuit receiving said analog input voltage and one or more outputs from said thresholding circuits corresponding to higher bits than said bit corresponding to said weighting circuit, said analog input voltage being weighted by a weight corresponding to said bit of said thresholding circuit, each said output being weighted by a ratio of a weight corresponding to bit of said weighting circuit;

said inverters of said first stage and said last stage having different thresholds to which an analog input voltage is input;

a digital to analog converter for converting an output of said first analog to digital converter;

a subtraction circuit for subtracting an output of said digital to analog converter from said analog input voltage; and a second analog to digital converter for generating a digital data of a plurality of bits from a most significant bit (MSB) to at least significant bit (LSB) in response to an analog input voltage comprising:
  (a) a plurality of thresholding circuits corresponding to said bits of said digital data, each said thresholding circuit comprising an odd number of inverters serially connected from a first stage to a last stage, said first stage inverter of each said thresholding circuit having a threshold equal to a weight of said corresponding bit; and
  (b) a plurality of weighting circuits connected to inputs of thresholding circuits of bits other than said MSB, each said weighting circuit receiving said analog input voltage and one or more outputs from said thresholding circuits corresponding to higher bits than said bit corresponding to said weighting circuit, said analog input voltage being weighted by a weight corresponding to said bit of said thresholding circuit, each said output being weighted by a ratio of a weight corresponding to bit of said weighting circuit; and said inverters of said first stage and last stage having different thresholds for converting an output of said subtraction circuit, wherein said first digital to analog converter outputs higher half bits of total bits and said second digital to analog converter outputs lower half bits.

12. An analog to digital converter as claimed in claim 11, wherein said digital to analog converter comprising a capacitive coupling connected at inputs thereof to multiplexers each having two inputs and one output and connected at outputs thereof to a common output terminal, said output of said first analog to digital converter is input to said multiplexers as control signals, a first level voltage and a second level voltage are connected to said inputs of said multiplexers.

13. An analog to digital converter as claimed in claim 12, wherein said subtraction circuit comprising:

an input capacitance connected at an input to said analog input voltage;

a first inverter connected to an output of said input capacitance;

a first feedback capacitance connected between an input and output of said first inverter;

an intermediate capacitance connected at an input to said output of said inverter;

a second inverter connected at an input to an output of said intermediate capacitance and an output of said second digital to analog converter; and a second feedback capacitance connected between said input and an output of said second inverter.

* * * * *